United States Patent
Kato

(10) Patent No.: US 9,628,737 B2
(45) Date of Patent: Apr. 18, 2017

(54) SOLID-STATE IMAGING DEVICE, AND IMAGING DEVICE

(71) Applicant: OLYMPUS CORPORATION, Tokyo (JP)

(72) Inventor: Hideki Kato, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/886,180

(22) Filed: Oct. 19, 2015

(65) Prior Publication Data

US 2016/0044265 A1 Feb. 11, 2016

Related U.S. Application Data

(63) Continuation of application No. PCT/JP2014/055149, filed on Feb. 28, 2014.

(30) Foreign Application Priority Data

Apr. 25, 2013 (JP) .................................. 2013-092968

(51) Int. Cl.
*H04N 5/3745* (2011.01)
*H04N 5/361* (2011.01)
(Continued)

(52) U.S. Cl.
CPC ... *H04N 5/37457* (2013.01); *H01L 27/14609* (2013.01); *H01L 27/14634* (2013.01);
(Continued)

(58) Field of Classification Search
CPC .... H04N 5/37457; H04N 5/378; H04N 5/357; H04N 5/341; H04N 5/361; H04N 5/369;
(Continued)

(56) References Cited

U.S. PATENT DOCUMENTS

| 8,446,181 B2* | 5/2013 | Keel | G11C 27/026 |
| | | | 327/91 |
| 8,766,843 B2* | 7/2014 | Ueno | H03M 1/0863 |
| | | | 341/155 |

(Continued)

FOREIGN PATENT DOCUMENTS

| JP | 2012-253593 A | 12/2010 |
| JP | 2012-248952 A | 12/2012 |

(Continued)

OTHER PUBLICATIONS

International Search Report dated Jun. 3, 2014, issued in counterpart International Application No. PCT/JP2014/055149 (1 page).

*Primary Examiner* — Pritham Prabhakher
(74) *Attorney, Agent, or Firm* — Westerman, Hattori, Daniels & Adrian, LLP

(57) ABSTRACT

Provided is a solid-state imaging device in which a first substrate and a second substrate having circuit elements, which constitute pixels, arranged thereon are electrically connected to each other. Each pixel includes: a photoelectric conversion unit disposed on the first substrate that outputs a signal based on incident light; a sampling transistor disposed on the second substrate that includes a gate terminal, a source terminal, and a drain terminal, that samples and holds the signal input from the photoelectric conversion unit to a first terminal, and outputs the sampled and held signal from a second terminal; a capacitor disposed on the second substrate that stores the signal output from the second terminal; and a potential fixing circuit that fixes a potential of the first terminal to a potential based on a predetermined fixed potential during a readout period in which the signal stored in the capacitor is read out.

7 Claims, 19 Drawing Sheets

(51) Int. Cl.
*H04N 5/369* (2011.01)
*H01L 27/146* (2006.01)
*H04N 5/341* (2011.01)
*H04N 5/357* (2011.01)
*H04N 5/378* (2011.01)

(52) U.S. Cl.
CPC ............ *H04N 5/341* (2013.01); *H04N 5/357* (2013.01); *H04N 5/361* (2013.01); *H04N 5/369* (2013.01); *H04N 5/3698* (2013.01); *H04N 5/378* (2013.01); *H04N 5/37452* (2013.01)

(58) Field of Classification Search
CPC ............ H04N 5/37452; H04N 5/3698; H01L 27/14609; H01L 27/14634
USPC ........................................................ 348/294
See application file for complete search history.

(56) References Cited

U.S. PATENT DOCUMENTS

| | | | |
|---|---|---|---|
| 8,830,368 B2 * | 9/2014 | Kato | H04N 5/335 257/443 |
| 8,896,736 B2 * | 11/2014 | Kobayashi | H04N 5/23241 348/302 |
| 2005/0243193 A1 * | 11/2005 | Gove | H04N 5/3575 348/241 |
| 2008/0048098 A1 * | 2/2008 | Hara | H04N 3/155 250/208.1 |
| 2011/0254592 A1 * | 10/2011 | Keel | G11C 27/026 327/91 |
| 2012/0086841 A1 * | 4/2012 | Ono | H04N 5/378 348/300 |
| 2013/0070133 A1 * | 3/2013 | Takazawa | H04N 5/335 348/294 |
| 2013/0092820 A1 * | 4/2013 | Takemoto | H04N 5/369 250/208.1 |
| 2013/0107093 A1 * | 5/2013 | Aoki | H04N 5/3745 348/302 |
| 2013/0181316 A1 * | 7/2013 | Tsukimura | H01L 31/02016 257/443 |
| 2013/0215302 A1 * | 8/2013 | Ueno | H03M 1/0863 348/300 |
| 2013/0229560 A1 * | 9/2013 | Kondo | H04N 5/374 348/308 |
| 2013/0250151 A1 * | 9/2013 | Kato | H04N 5/335 348/300 |

FOREIGN PATENT DOCUMENTS

| | | |
|---|---|---|
| JP | 2013-9294 A | 1/2013 |
| JP | 2013-9301 A | 1/2013 |

* cited by examiner

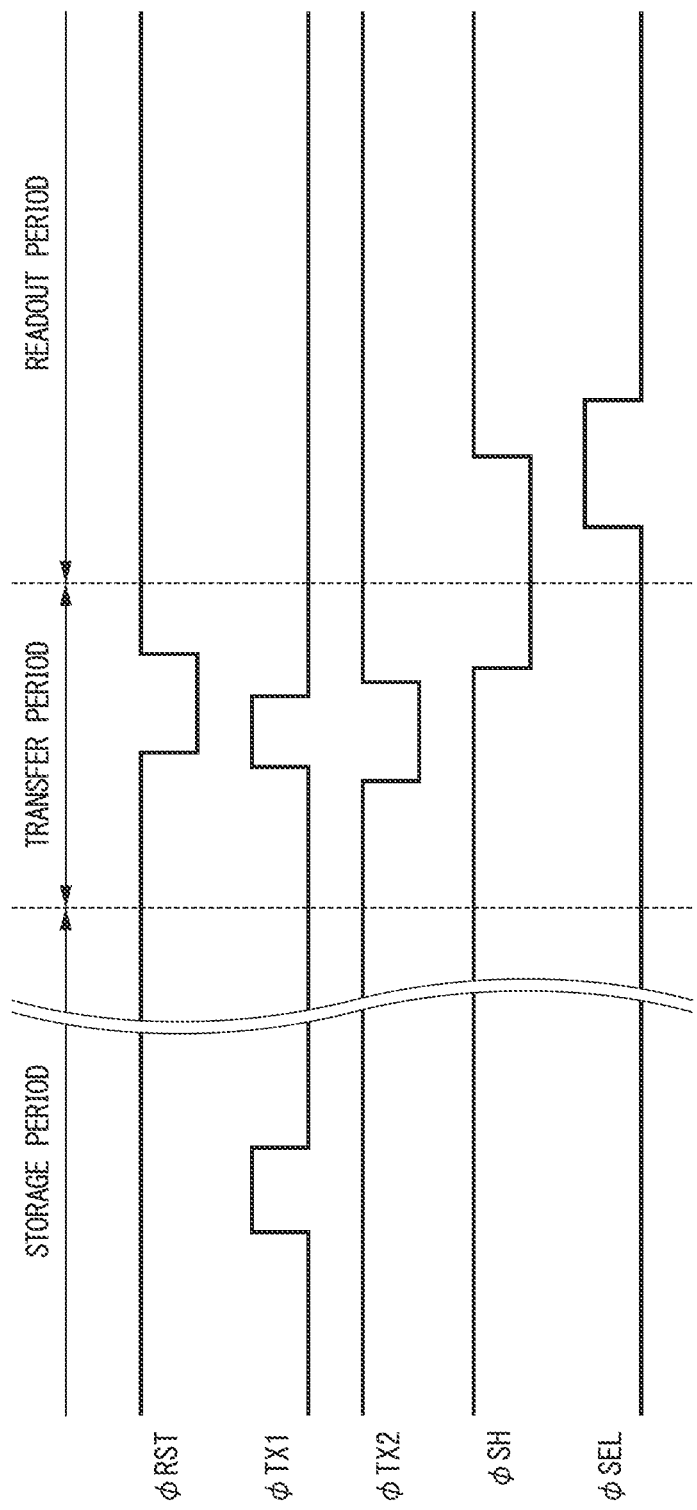

SOLID-STATE IMAGING DEVICE, AND IMAGING DEVICE

CROSS REFERENCE TO RELATED APPLICATIONS

This application is a continuation application based on a PCT Patent Application No. PCT/JP2014/055149, filed Feb. 28, 2014, whose priority is claimed on Japanese Patent Application No. 2013-092968, filed Apr. 25, 2013, the entire content of which are hereby incorporated by reference.

BACKGROUND OF THE INVENTION

Field of the Invention

The present invention relates to a solid-state imaging device in which a first substrate and a second substrate having circuit elements of pixels arranged thereon are electrically connected to each other and an imaging device including the solid-state imaging device.

Description of the Related Art

In recent years, video cameras, electronic still cameras, and the like have generally become widespread. Such cameras employ a charge-coupled device (CCD) type solid-state imaging device or an amplification type solid-state imaging device. The amplification type solid-state imaging device introduces signal charges, which are generated and stored by photoelectric conversion units of pixels on which light is incident, into amplification elements of the pixels and outputs signals, which are amplified by the amplification elements, from the pixels. In the amplification type solid-state imaging device, such pixels are arranged in a two-dimensional matrix shape. Examples of the amplification type solid-state imaging device include a CMOS type solid-state imaging device using complementary metal oxide semiconductor (CMOS) transistors.

In the related art, CMOS type solid-state imaging devices employ a method of sequentially reading out signal charges, which are generated by photoelectric conversion units of pixels arranged in a two-dimensional matrix shape, for each row. In this method, since exposure timings in the photoelectric conversion units of the pixels are determined depending on a start and an end of reading-out of signal charges, the exposure timings differ depending on the rows. Accordingly, when a fast-moving subject is imaged using such a CMOS type solid-state imaging device, distortion of the subject occurs in the captured image.

In order to remove the distortion of a subject, a simultaneous imaging function (global shutter function) to realize simultaneous storage of signal charges has been proposed. The number of applications of CMOS type solid-state imaging devices having a global shutter function is increasing. CMOS type solid-state imaging devices having a global shutter function generally need to include storage capacitors having a light-blocking effect in order to store signal charges generated by the photoelectric conversion units until the signal charges are read out. In such CMOS type solid-state imaging devices, all pixels are simultaneously exposed, signal charges generated by the photoelectric conversion units are simultaneously transferred to the storage capacitors in all the pixels and are temporarily stored therein, and the signal charges are sequentially converted into pixel signals and read out at a predetermined readout timing.

However, in the CMOS type solid-state imaging device having a global shutter function, the photoelectric conversion units and the storage capacitors have to be formed on the same plane of the same substrate and thus an increase in chip area is inevitable. In a waiting period until signal charges stored in the storage capacitors are read out, signal quality degrades due to noise based on light or noise based on a leakage current (dark current) generated in the storage capacitors A solid-state imaging device in which a first substrate having photoelectric conversion units formed thereon and a second substrate having storage capacitors formed thereon are bonded to each other and the first substrate and the second substrate are electrically connected to each other by microbumps is disclosed in Japanese Unexamined Patent Application, First Publication No. 2013-9294 (hereinafter referred to as Patent Literature 1).

The solid-state imaging device disclosed in Patent Literature 1 is provided with a clamping capacitor for fixing a voltage based on signal charges generated by the photoelectric conversion unit of the first substrate and a sampling transistor (the sampling transistor 108 in Patent Literature 1) for sampling and holding the signal charges in a storage capacitor (the analog memory 110 in Patent Literature 1) of the second substrate. One end (drain terminal or source terminal) of the sampling transistor connected to the clamping capacitor is in a floating state in which the potential is not fixed while the sampling transistor is turned off.

The solid-state imaging device disclosed in Patent Literature 1 is provided with an amplification transistor (first amplification transistor 105 in Patent Literature 1) outputting an amplified signal to the clamping capacitor and a current source (load transistor 106 in Patent Literature 1) constituting a source follower circuit along with the amplification transistor. During a period (readout period) in which the signal charges stored in the storage capacitor are read out, since the current source is turned off, one end of the current source connected to the amplification transistor is in a floating state.

SUMMARY

According to a first aspect of the present invention, provided is a solid-state imaging device in which a first substrate and a second substrate having circuit elements, which constitute pixels, arranged thereon are electrically connected to each other. Each pixel includes: a photoelectric conversion unit that is disposed on the first substrate and outputs a signal based on incident light; a sampling transistor that is disposed on the second substrate, includes a gate terminal, a source terminal, and a drain terminal, samples and holds the signal input from the photoelectric conversion unit to a first terminal which is one of the source terminal or the drain terminal, and outputs the sampled and held signal from a second terminal which is the other of the source terminal or the drain terminal; a capacitor that is disposed on the second substrate and stores the signal output from the second terminal; and a potential fixing circuit that fixes a potential of the first terminal to a potential based on a predetermined fixed potential during a readout period in which the signal stored in the capacitor is read out.

According to a second aspect of the present invention, provided is a solid-state imaging device in which a first substrate and a second substrate having circuit elements, which constitute pixels, arranged thereon are electrically connected to each other. Each pixel includes: a photoelectric conversion unit that is disposed on the first substrate and that outputs a signal based on incident light; a sampling transistor that is disposed on the first substrate, that includes a gate terminal, a source terminal, and a drain terminal, samples and holds the signal input from the photoelectric conversion unit to a first terminal which is one of the source terminal or the drain terminal, and outputs the sampled and held signal from a second terminal which is the other of the source terminal or the drain terminal; a capacitor that is disposed on the second substrate and stores the signal output from the second terminal; and a potential fixing circuit that fixes a potential of the first terminal to a potential based on a predetermined fixed potential during a readout period in which the signal stored in the capacitor is read out.

According to a third aspect of the present invention, in the solid-state imaging device according to the first aspect, each pixel may further include: a clamping capacitor that is disposed on the first substrate or the second substrate and clamps the signal output from the photoelectric conversion unit; and a clamping transistor that is disposed on the same substrate as the substrate on which the clamping capacitor is disposed and includes a second gate terminal, a second source terminal, and a second drain terminal, in which a third terminal which is one of the second source terminal or the second drain terminal is connected to the clamping capacitor and the first terminal of the sampling transistor and a fourth terminal which is the other of the second source terminal or the second drain terminal is connected to a voltage source supplying the fixed potential. The clamping transistor may be included in the potential fixing circuit and fixes the potential of the first terminal to a potential based on the fixed potential supplied from the voltage source during the readout period.

According to a fourth aspect of the present invention, in the solid-state imaging device according to the second aspect, each pixel may further include: a clamping capacitor that is disposed on the first substrate and clamps the signal output from the photoelectric conversion unit; and a clamping transistor that is disposed on the first substrate and includes a second gate terminal, a second source terminal, and a second drain terminal, in which a third terminal which is one of the second source terminal or the second drain terminal is connected to the clamping capacitor and the first terminal of the sampling transistor and a fourth terminal which is the other of the second source terminal or the second drain terminal is connected to a voltage source supplying the fixed potential. The clamping transistor may be included in the potential fixing circuit and fixes the potential of the first terminal to a potential based on the fixed potential supplied from the voltage source during the readout period.

According to a fifth aspect of the present invention, the solid-state imaging device according to the third aspect may include a plurality of the pixels, wherein the single clamping capacitor and the single clamping transistor are shared by the plurality of pixels.

According to a sixth aspect of the present invention, the solid-state imaging device according to the fourth aspect may include a plurality of the pixels, wherein the single clamping capacitor and the single clamping transistor are shared by the plurality of pixels.

According to a seventh aspect of the present invention, in the solid-state imaging device according to the first aspect, each pixel may further include: an amplification transistor that is disposed on the first substrate, includes a second gate terminal to which the signal output from the photoelectric conversion unit is input, a second source terminal, and a second drain terminal, amplifies the signal input to the second gate terminal, and outputs the amplified signal from one of the second source terminal or the second drain terminal; and a reset transistor that is disposed on the first substrate, includes a third gate terminal, a third source terminal, and a third drain terminal, and resets the photoelectric conversion unit, in which a third terminal which is one of the third source terminal or the third drain terminal is connected to a voltage source supplying the fixed potential and a fourth terminal which is the other of the third source terminal or the third drain terminal is connected to the photoelectric conversion unit. The reset transistor may be included in the potential fixing circuit and fix the potential of the first terminal by fixing the potential of the second gate terminal of the amplification transistor to a potential based on the fixed potential supplied from the voltage source during the readout period.

According to an eighth aspect of the present invention, in the solid-state imaging device according to the first aspect, each pixel may further include: an amplification transistor that is disposed on the first substrate, includes a second gate terminal to which a signal output from the photoelectric conversion unit is input, a second source terminal, and a second drain terminal, amplifies the signal input to the second gate terminal, and outputs the amplified signal from one of the second source terminal or the second drain terminal; and a current source that is disposed on the first substrate or the second substrate and includes a first end, which is connected to either of the second source terminal or the second drain terminal of the amplification transistor, and a second end. The fixed potential may be input to the second end of the current source during the readout period and consequently the first end and the second end have substantially the same potential.

According to a ninth aspect of the present invention, an imaging device includes the solid-state imaging device according to the first aspect.

BRIEF DESCRIPTION OF THE DRAWINGS

FIG. 19 is a timing chart illustrating an operation of a unit pixel in the solid-state imaging device according to the fifth embodiment of the present invention.

DETAILED DESCRIPTION OF THE PREFERRED EMBODIMENTS

Hereinafter, embodiments of the present invention will be described with reference to the accompanying drawings.

First Embodiment

Figure 1:
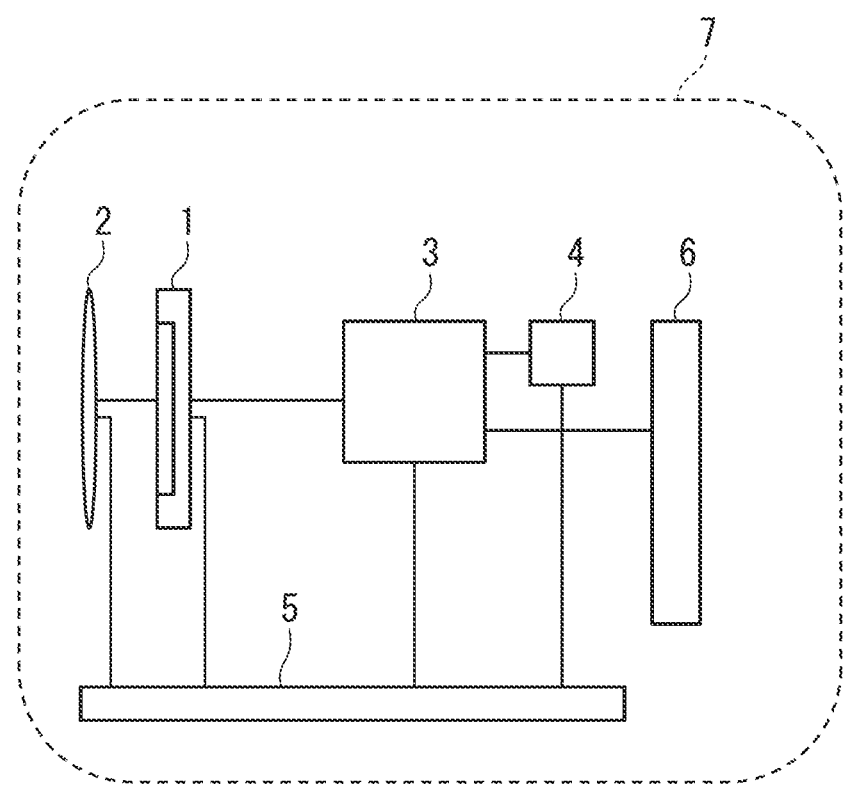
FIG. 1 is a block diagram illustrating a configuration of a digital camera according to a first embodiment of the present invention.

First, a first embodiment of the present invention will be described below. FIG. 1 illustrates a configuration of a digital camera which is an example of an imaging device according to this embodiment. As illustrated in FIG. 1, the digital camera 7 includes a solid-state imaging device 1, a lens unit 2, an image processing device 3, a recording device 4, a camera controller 5, and a display device 6.

The lens unit 2 includes an optical system such as a lens and focuses a subject image, which is formed by light from a subject, on the solid-state imaging device 1. Zooming, focusing, driving of an aperture diaphragm, and the like of the lens unit 2 are controlled by the camera controller 5. The solid-state imaging device 1 is a MOS type imaging device that converts light of a subject incident on the digital camera 7 via the lens unit 2 into an image signal. The driving of the solid-state imaging device 1 is controlled by the camera controller 5. Details of the solid-state imaging device 1 will be described later.

The image processing device 3 performs processes of amplifying a signal, converting an image signal into image data, and the like on the image signal output from the solid-state imaging device 1 and performs various processes such as correction and compression on the converted image data. The recording device 4 is a detachable recording medium such as a semiconductor memory and records and reads out the image data. The display device 6 is a display device such as a liquid crystal display device that displays an image based on image data based on an image signal output from the solid-state imaging device 1 or image data read out from the recording device 4.

Figure 2:
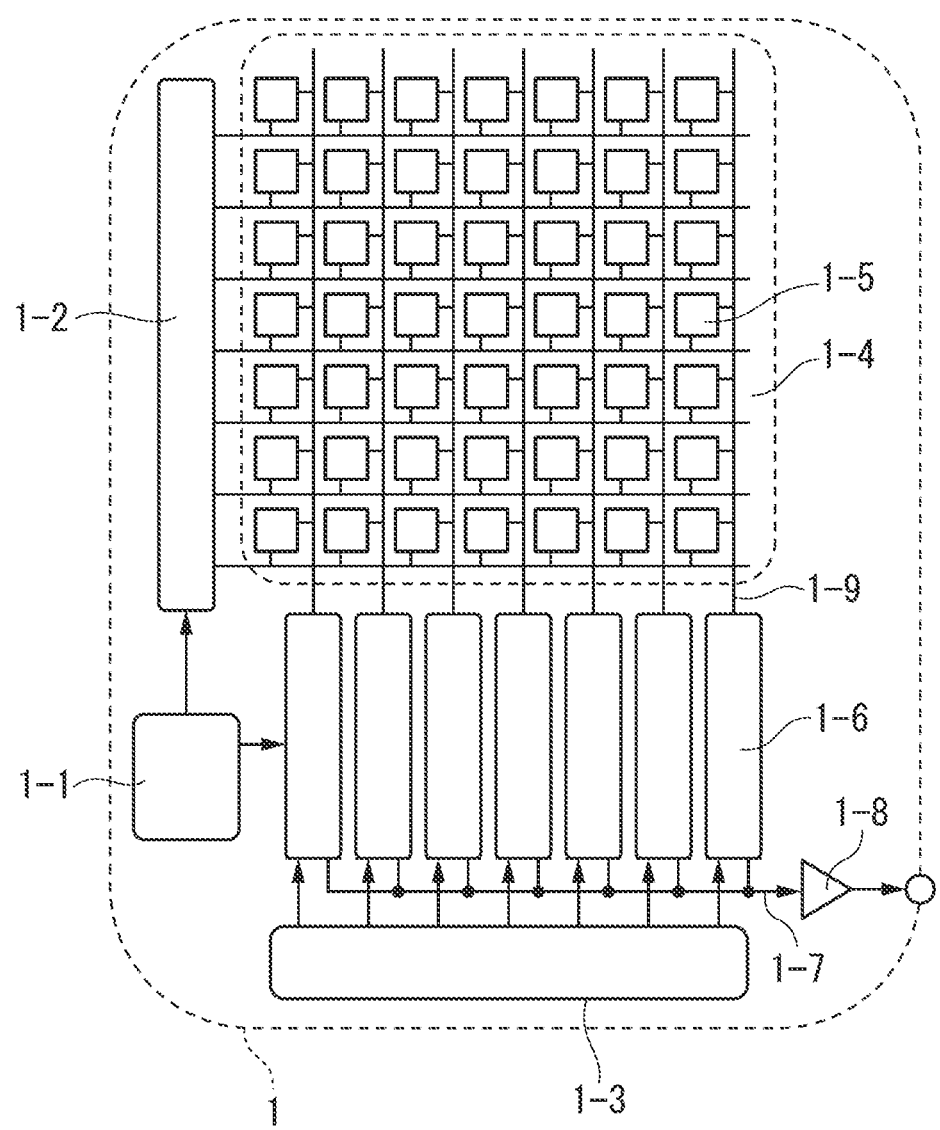
FIG. 2 is a block diagram illustrating a configuration of a solid-state imaging device according to the first embodiment of the present invention.

FIG. 2 illustrates the configuration of the solid-state imaging device 1. As illustrated in FIG. 2, the solid-state imaging device 1 includes a control signal generating circuit 1-1, a vertical readout control circuit 1-2, a horizontal readout control circuit 1-3, a pixel array unit 1-4 including a plurality of unit pixels 1-5, a column signal processing unit 1-6, and an output circuit 1-8.

The control signal generating circuit 1-1 generates control signals for controlling the vertical readout control circuit 1-2, the horizontal readout control circuit 1-3, and the column signal processing unit 1-6 and supplies the control signals thereto. The vertical readout control circuit 1-2 controls the unit pixels 1-5 in the pixel array unit 1-4 for each row and outputs pixel signals of the unit pixels 1-5 to a vertical signal line 1-9 which is provided for each column. The control of the unit pixels 1-5 which is performed by the vertical readout control circuit 1-2 includes a reset operation, a storage operation, a signal readout operation of the unit pixels 1-5, and the like. In order to perform this control, the vertical readout control circuit 1-2 outputs the control signals (control pulses) to the unit pixels 1-5 to control the unit pixels 1-5 independently for each row.

In the pixel array unit 1-4, a plurality of unit pixels 1-5 are arranged in a two-dimensional matrix shape. In FIG. 2, 49 unit pixels 1-5 are arranged in 7 rows×7 columns, but the arrangement of the unit pixels 1-5 illustrated in FIG. 2 is only an example, and the number of rows and the number of columns need only be equal to or greater than 2.

The column signal processing unit 1-6 is connected to the vertical signal line 1-9 which is provided for each column and performs signal processes such as suppression of noise or signal amplification before the A/D conversion on the pixel signal output to the vertical signal line 1-9. The horizontal readout control circuit 1-3 sequentially reads out the output signals of the column signal processing units 1-6 to a horizontal signal line 1-7. The signals read out to the horizontal signal line 1-7 are output to the outside of the solid-state imaging device 1 via the output circuit 1-8.

Figure 3:
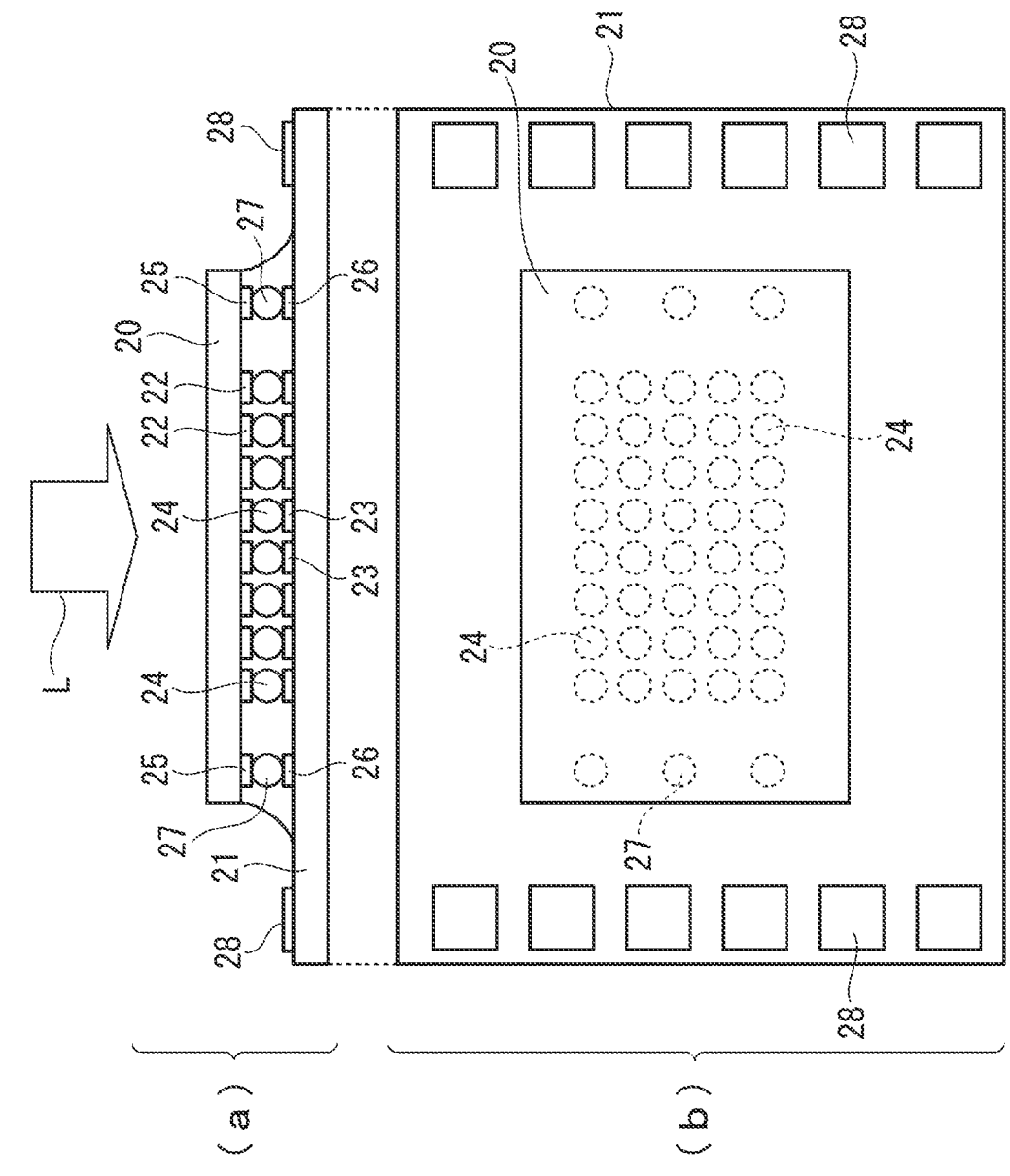
FIG. 3 illustrates a cross-sectional view and plane view of the solid-state imaging device according to the first embodiment of the present invention.

(a) of FIG. 3 illustrates a cross-sectional structure of the solid-state imaging device 1, and (b) of FIG. 3 illustrates a planar structure of the solid-state imaging device 1. The solid-state imaging device 1 has a structure in which two substrates (a first substrate 20 and a second substrate 21) having circuit elements (such as photoelectric conversion units, transistors, and capacitors), which constitute the unit pixels 1-5, arranged thereon are superimposed. The circuit elements constituting the unit pixels 1-5 are distributed and arranged on the first substrate 20 and the second substrate 21. The first substrate 20 and the second substrate 21 are electrically connected to each other so that an electrical signal can be transmitted and received between the two substrates when the unit pixels 1-5 are driven.

Among two main surfaces (surfaces having a surface area greater than side surfaces) of the first substrate 20, the photoelectric conversion units are formed on the main surface which is irradiated with light L, and light with which the first substrate 20 is irradiated is incident on the photoelectric conversion units. Among two main surfaces of the first substrate 20, a plurality of micropads 22 which are electrodes for connection to the second substrate 21 are formed on the main surface opposite to the main surface which is irradiated with light L. One micropad 22 is disposed for every pixel or every plurality of pixels. Among two main surfaces of the second substrate 21, a plurality of micropads 23 which are electrodes for connection to the first substrate are formed at positions corresponding to the micropads 22 on the main surface facing the first substrate 20.

Microbumps 24 are formed between the micropads 22 and the micropads 23. The first substrate 20 and the second substrate 21 are disposed to overlap each other such that the micropads 22 and the micropads 23 face each other, and are unified such that the micropads 22 and the micropads 23 are electrically connected to each other by the microbumps 24. The micropads 22, the microbumps 24, and the micropads 23 constitute a connection section that electrically connects the first substrate 20 and the second substrate 21 to each other. Signals based on signal charges generated by the photoelectric conversion units disposed on the first substrate 20 are output to the second substrate 21 via the micropads 22, the microbumps 24, and the micropads 23.

Among two main surfaces of the first substrate 20, micropads 25 having the same structure as the micropads 22 are formed in the peripheral portion of the main surface opposite to the main surface which is irradiated with light L. Among two main surfaces of the second substrate 21, micropads 26 having the same structure as the micropads 23 are formed at positions corresponding to the micropads 25 on the main surface facing the first substrate 20. Microbumps 27 are formed between the micropads 25 and the micropads 26. A source voltage or the like for driving the circuit elements arranged on the first substrate 20 or the circuit elements arranged on the second substrate 21 is supplied from the first substrate 20 to the second substrate 21 or from the second substrate 21 to the first substrate 20 via the micropads 25, the microbumps 27, and the micropads 26.

Pads 28 serving as an interface with a system other than the first substrate 20 and the second substrate 21 are formed in the peripheral portion of one main surface of two main surfaces of the second substrate 21. Instead of the pads 28, penetration electrodes penetrating the second substrate 21 may be formed and may be used as electrodes for connection to the outside. In the example illustrated in FIG. 3, the areas of the main surfaces of the first substrate 20 and the second substrate 21 are different from each other, but the areas of the main surfaces of the first substrate 20 and the second substrate 21 may be equal to each other. The first substrate 20 and the second substrate 21 may be connected to each other by directly bonding the micropads (first electrodes) formed on the surface of the first substrate 20 and the micropads (second electrodes) formed on the surface of the second substrate 21 to each other instead of forming the microbumps.

The circuit elements constituting the unit pixels 1-5 are distributed and arranged onto the first substrate 20 and the second substrate 21. Aside from the unit pixels 1-5, the control signal generating circuit 1-1, the vertical readout control circuit 1-2, the horizontal readout control circuit 1-3, the column signal processing unit 1-6, and the output circuit 1-8 may be disposed in any of the first substrate 20 and the second substrate 21. The circuit elements constituting each of the control signal generating circuit 1-1, the vertical readout control circuit 1-2, the horizontal readout control circuit 1-3, the column signal processing unit 1-6, and the output circuit 1-8 may be distributed and arranged on the first substrate 20 and the second substrate 21. For elements other than the unit pixels 1-5, signals may be transmitted and received between the first substrate 20 and the second substrate 21, but the first substrate 20 and the second substrate 21 can be connected to each other by connecting the first substrate 20 and the second substrate 21 using the micropads and the microbumps in the same way as the unit pixels 1-5 or directly connecting the micropads to each other.

Figure 4:
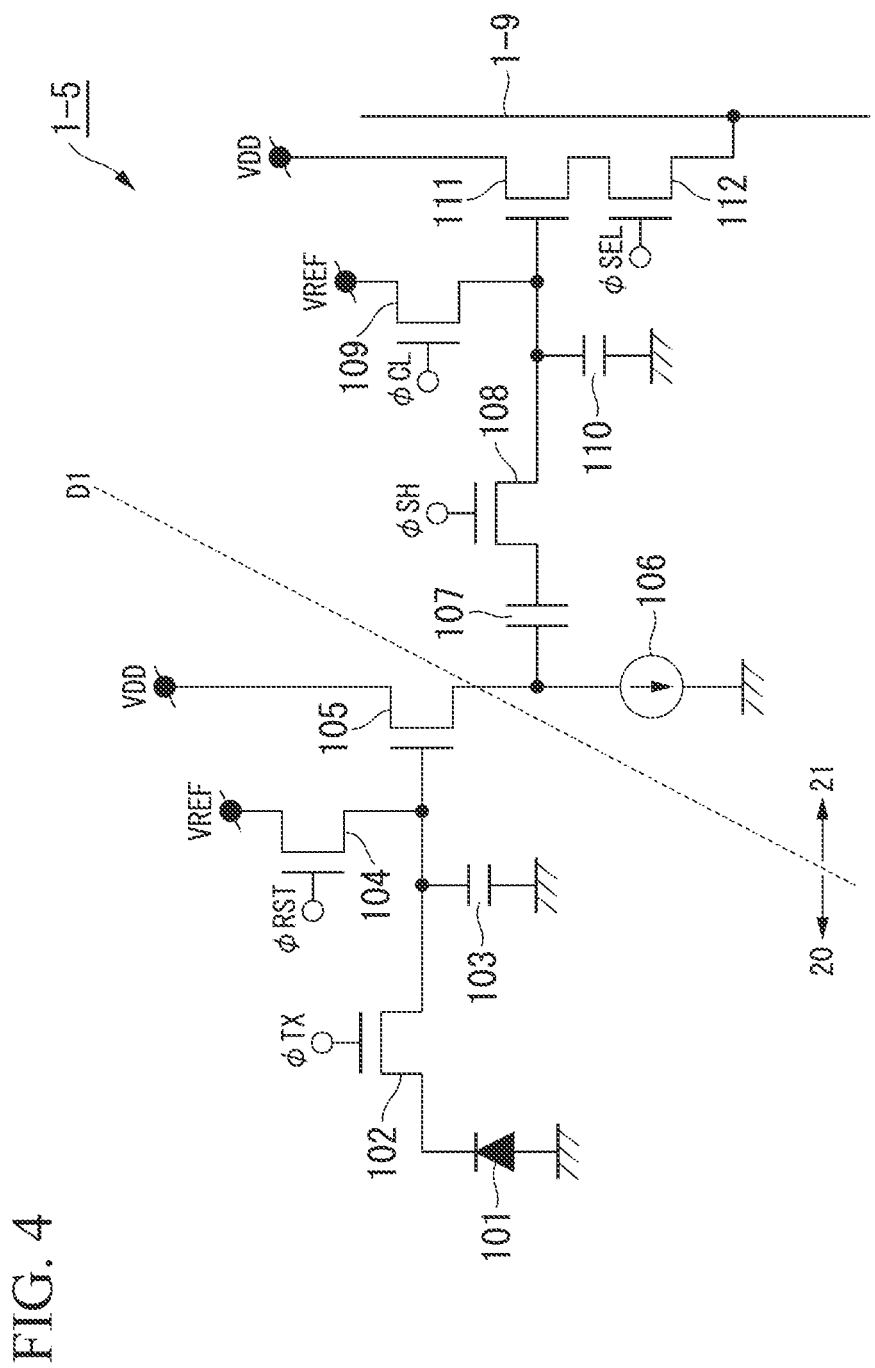
FIG. 4 is a circuit diagram illustrating a circuit configuration of a unit pixel in the solid-state imaging device according to the first embodiment of the present invention.

FIG. 4 illustrates the configuration of a unit pixel 1-5. The unit pixel 1-5 includes a photoelectric conversion unit 101, a transfer transistor 102, a floating diffusion (FD) 103, an FD reset transistor 104, a first amplification transistor 105, a current source 106, a clamping capacitor 107, a sampling transistor 108, a clamping transistor 109, an analog memory 110, a second amplification transistor 111, and a selection transistor 112.

An end of the photoelectric conversion unit 101 is grounded. The drain terminal of the transfer transistor 102 is connected to the other end of the photoelectric conversion unit 101. The gate terminal of the transfer transistor 102 is connected to the vertical readout control circuit 1-2 and is supplied with a transfer pulse φTX.

An end of the FD 103 is connected to the source terminal of the transfer transistor 102 and the other end of the FD 103 is grounded. The drain terminal of the FD reset transistor 104 is connected to a reference voltage source supplying a reference voltage VREF and the source terminal of the FD reset transistor 104 is connected to the source terminal of the transfer transistor 102. The gate terminal of the FD reset transistor 104 is connected to the vertical readout control circuit 1-2 and is supplied with an FD reset pulse φRST.

The drain terminal of the first amplification transistor 105 is connected to a power source supplying a source voltage VDD. The gate terminal which is an input terminal of the first amplification transistor 105 is connected to the source terminal of the transfer transistor 102. An end of the current source 106 is connected to the source terminal of the first amplification transistor 105 and the other end of the current source 106 is grounded. For example, the current source 106 may be constituted by a transistor of which the drain terminal is connected to the source terminal of the first amplification transistor 105, the source terminal is grounded, and the gate terminal is connected to the vertical readout control circuit 1-2. An end of the clamping capacitor 107 is connected to the source terminal of the first amplification transistor 105 and one end of the current source 106.

The drain terminal of the sampling transistor 108 is connected to the other end of the clamping capacitor 107. The gate terminal of the sampling transistor 108 is connected to the vertical readout control circuit 1-2 and is supplied to a sampling pulse φSH.

The drain terminal of the clamping transistor 109 is connected to the reference voltage source supplying the reference voltage VREF and the source terminal of the clamping transistor 109 is connected to the source terminal of the sampling transistor 108. The gate terminal of the clamping transistor 109 is connected to the vertical readout control circuit 1-2 and is supplied with a clamping & memory reset pulse φCL.

An end of the analog memory 110 is connected to the source terminal of the sampling transistor 108 and the other end of the analog memory 110 is grounded. The drain terminal of the second amplification transistor 111 is connected to the power source supplying the source voltage VDD. The gate terminal which is an input terminal of the second amplification transistor 111 is connected to the source terminal of the sampling transistor 108. The drain terminal of the selection transistor 112 is connected to the source terminal of the second amplification transistor 111 and the source terminal of the selection transistor 112 is connected to the vertical signal line 1-9. The gate terminal of the selection transistor 112 is connected to the vertical readout control circuit 1-2 and is supplied with a selection pulse φSEL. The above-mentioned transistors may be inverted in polarity and the source terminals and the drain terminals may be inverted.

The photoelectric conversion unit 101 is, for example, a photodiode and serves to generate signal charges based on incident light, to retain and store the generated signal charges, and to output the signal charges after a predetermined period of time elapses. The transfer transistor 102 is a transistor that transfers the signal charges stored in the photoelectric conversion unit 101 to the FD 103. The ON/OFF of the transfer transistor 102 is controlled by the transfer pulse φTX from the vertical readout control circuit 1-2. The FD 103 is a capacitor that temporarily retains and stores the signal charges transferred from the photoelectric conversion unit 101.

The FD reset transistor 104 is a transistor that resets the FD 103. The ON/OFF of the FD reset transistor 104 is controlled by the FD reset pulse φRST from the vertical readout control circuit 1-2. By simultaneously turning on the FD reset transistor 104 and the transfer transistor 102, the photoelectric conversion unit 101 may be reset. The resetting of the FD 103 and the photoelectric conversion unit 101 serves to control an amount charges stored in the FD 103 and the photoelectric conversion unit 101 such that the state (potential) of the FD 103 and the photoelectric conversion unit 101 is set to a reference state (a reference potential, a reset level).

The first amplification transistor 105 is a transistor that outputs an amplified signal, which is obtained by amplifying a signal input to the gate terminal thereof and based on the signal charges stored in the FD 103, from the source terminal thereof. The current source 106 serves as a load of the first amplification transistor 105 and supplies a current for driving the first amplification transistor 105 to the first amplification transistor 105. The first amplification transistor 105 and the current source 106 constitute a source follower circuit.

The clamping capacitor 107 is a capacitor that clamps (fixes) a voltage level of the amplified signal output from the first amplification transistor 105. The sampling transistor 108 is a transistor that samples and holds the voltage level of the other end of the clamping capacitor 107 and stores the voltage level in the analog memory 110. The ON/OFF of the sampling transistor 108 is controlled by the sampling pulse φSH from the vertical readout control circuit 1-2.

The clamping transistor 109 is a transistor that resets the analog memory 110. The resetting of the analog memory 110 serves to control an amount of charges stored in the analog memory 110 such that the state (potential) of the analog memory 110 is set to a reference state (a reference potential, a reset level). The analog memory 110 is a capacitor that retains and stores an analog signal sampled and held by the sampling transistor 108.

The capacitance value of the analog memory 110 is set to a value greater than the capacitance value of the FD 103. Preferably, a metal insulator metal (MIM) capacitor or a metal oxide semiconductor (MOS) capacitor which is a capacitor having a small leakage current (dark current) per unit area is used as the analog memory 110. Accordingly, it is possible to improve resistance to noise and thus to obtain a high-quality signal.

The second amplification transistor 111 is a transistor that outputs an amplified signal, which is obtained by amplifying a signal input to the gate terminal thereof and based on the signal charges stored in the analog memory 110, from the source terminal thereof. The selection transistor 112 is a transistor that selects a unit pixel 1-5 and outputs a signal amplified by the second amplification transistor 111 to the vertical signal line 1-9. The ON/OFF of the selection transistor 112 is controlled by the selection pulse φSEL from the vertical readout control circuit 1-2.

A dotted line D1 in FIG. 4 indicates a boundary between the first substrate 20 and the second substrate 21. The photoelectric conversion unit 101, the transfer transistor 102, the FD 103, the FD reset transistor 104, and the first amplification transistor 105 are disposed in the first substrate 20. The current source 106, the clamping capacitor 107, the sampling transistor 108, the clamping transistor 109, the analog memory 110, the second amplification transistor 111, and the selection transistor 112 are disposed in the second substrate 21.

The amplified signal output from the first amplification transistor 105 of the first substrate 20 is output to the second substrate 21 via the micropads 22, the microbumps 24, and the micropads 23. The source voltage VDD and the reference voltage VREF are transferred between the first substrate 20 and the second substrate 21 via the micropads 25, the microbumps 27, and the micropads 26.

In FIG. 4, a connecting section including the micropads 22, the microbumps 24, and the micropads 23 is disposed on a path among the source terminal of the first amplification transistor 105, the drain terminal of the current source 106, and one end of the clamping capacitor 107, but is not limited to this path. The connecting section may be disposed at any position on a path electrically connecting the photoelectric conversion unit 101 to the analog memory 110.

Figure 5:
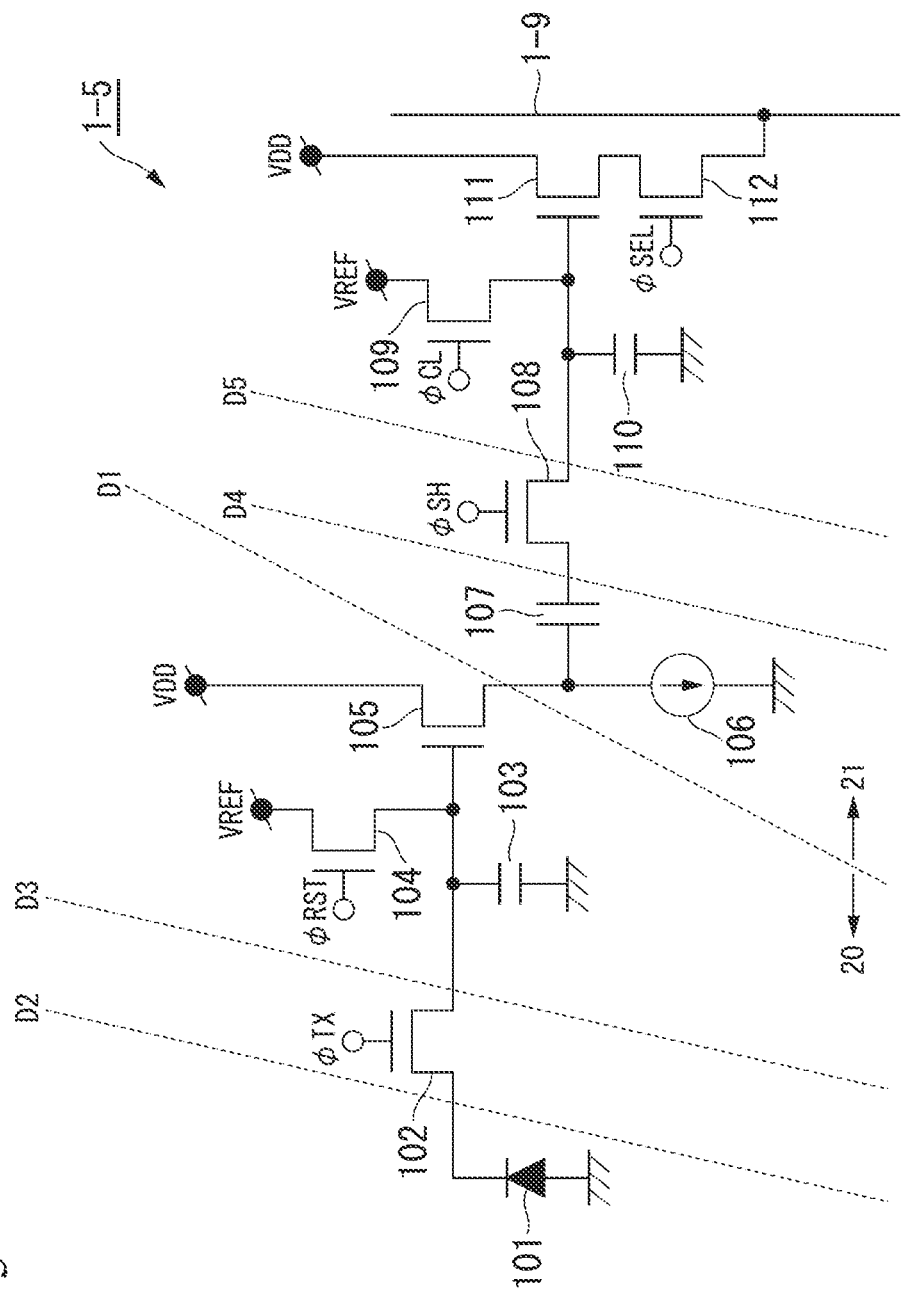
FIG. 5 is a circuit diagram illustrating a circuit configuration of a unit pixel in the solid-state imaging device according to the first embodiment of the present invention.

FIG. 5 illustrates examples of the boundary between the first substrate 20 and the second substrate 21. Dotted lines D1 to D5 indicate possible examples of the boundary between the first substrate 20 and the second substrate 21. The boundary between the first substrate 20 and the second substrate 21 may be any one of the dotted lines D1 to D5, as long as the photoelectric conversion unit 101 is disposed in the first substrate 20 and the analog memory 110 is disposed in the second substrate. The dotted line D1 is the same as described above. In the example indicated by the dotted line D2, the connecting portion is disposed on a path between the other end of the photoelectric conversion unit 101 and the drain terminal of the transfer transistor 102. In the example indicated by the dotted line D3, the connecting section is disposed on a path among the source terminal of the transfer transistor 102, one end of the FD 103, the source terminal of the FD reset transistor 104, and the gate terminal of the first amplification transistor 105.

In the example indicated by dotted line D4, the connecting section is disposed on a path between the other end of the clamping capacitor 107 and the drain terminal of the sampling transistor 108. In the example indicated by dotted line D5, the connecting section is disposed on a path among the source terminal of the sampling transistor 108, the source terminal of the clamping transistor 109, one end of the analog memory 110, and the gate terminal of the second amplification transistor 111.

The sampling transistor 108 and the analog memory 110 constitute a signal retaining portion that retains a signal output from the photoelectric conversion unit 101. When a signal corresponding to the signal charges output from the photoelectric conversion unit 101 is input to the drain terminal (the first terminal) of the sampling transistor 108, the sampling transistor 108 samples and holds the signal input to the drain terminal thereof and outputs the sampled and held signal from the source terminal (the second terminal) thereof. The analog memory 110 stores the signal output from the source terminal of the sampling transistor 108.

As described above, the FD reset transistor 104 in which the drain terminal (the third terminal) thereof is connected to the reference voltage source supplying the reference voltage VREF and the source terminal (the fourth terminal) thereof is connected to the photoelectric conversion unit 101 via the transfer transistor 102 resets the photoelectric conversion unit 101. As will be described below in detail, the FD reset transistor 104 fixes the potential of the drain terminal of the sampling transistor 108 by fixing the potential of one end of the FD 103 and the gate terminal of the first amplification transistor 105 to a potential based on the fixed potential (VREF) supplied from the reference voltage source during a readout period in which the signal based on the signal charges stored in the analog memory 110 is read out. Accordingly, it is possible to suppress a variation in potential of the drain terminal of the sampling transistor 108 due to noise such as 1/f noise and thus to improve noise resistance.

Figure 6:
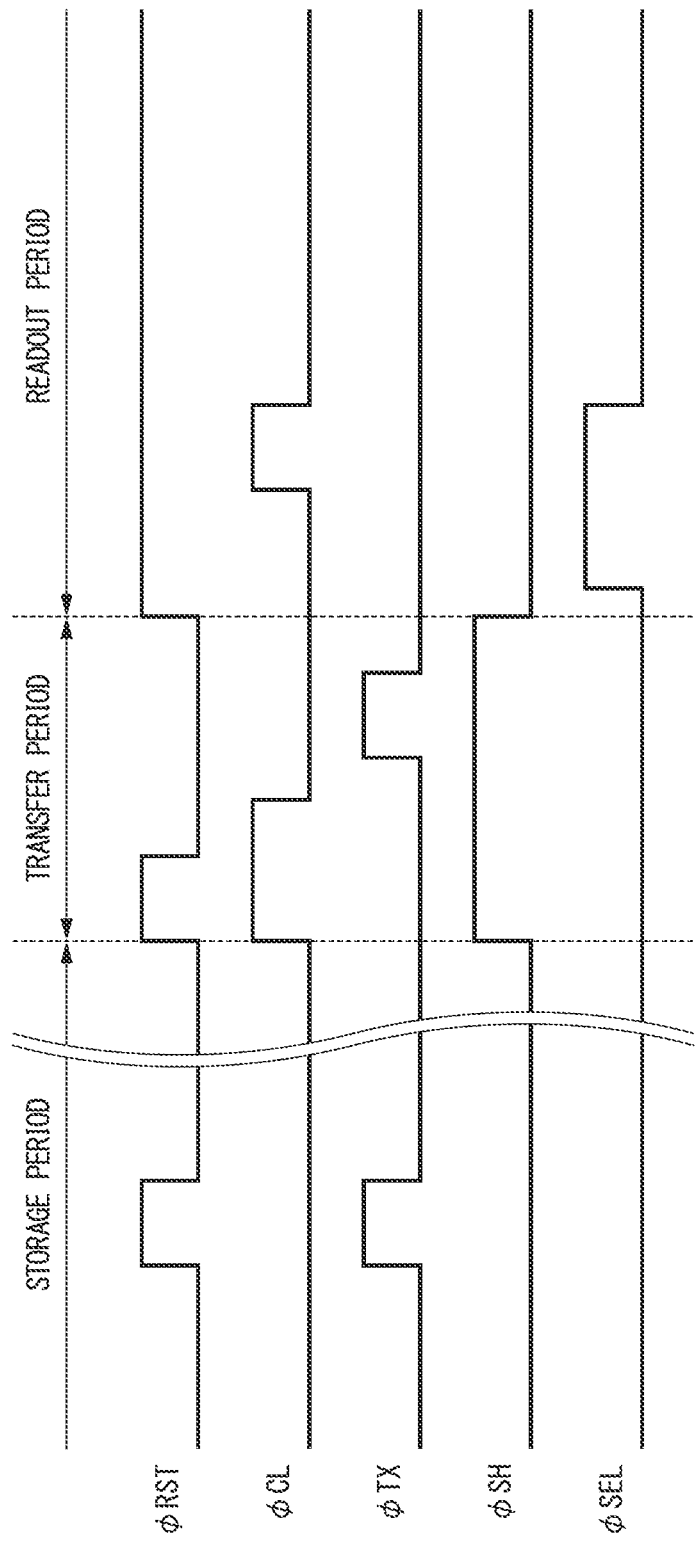
FIG. 6 is a timing chart illustrating an operation of a unit pixel in the solid-state imaging device according to the first embodiment of the present invention.

The operation of a unit pixel 1-5 will be described below with reference to FIG. 6. FIG. 6 illustrates a control signal which is supplied to the unit pixel 1-5 from the vertical readout control circuit 1-2 for each row. In the following description, all the unit pixels 1-5 are referred to as all the pixels.

(Operation in Storage Period)

A storage period is a period common to all the pixels and the operation is simultaneously performed in all the pixels in the storage period. First, when the transfer pulse φTX and the FD reset pulse φRST are changed from a low (L) level to a high (H) level, the transfer transistor 102 and the FD reset transistor 104 are turned on. Accordingly, the photoelectric conversion units 101 of all the pixels are reset. Subsequently, when the transfer pulse φTX and the FD reset pulse φRST are changed from the H level to the L level, the transfer transistor 102 and the FD reset transistor 104 are turned off. Accordingly, the resetting of all the pixels ends and exposure (storage of signal charges) of all the pixels starts all at once (start of an exposure period).

(Operation in Transfer Period)

A transfer period is a period common to all the pixels, and the operation is simultaneously performed in all the pixels in the transfer period. First, when the FD reset pulse φRST is changed from the L level to the H level, the FD reset transistor 104 is turned on. Accordingly, the FDs 103 of all the pixels are reset. At the same time, when the clamping & memory reset pulse φCL is changed from the L level to the H level, the clamping transistor 109 is turned on. Accordingly, the analog memories 110 of all the pixels are reset.

At the same time, when the sampling pulse φSH is changed from the L level to the H level, the sampling transistor 108 is turned on. Accordingly, the potential of the other end of the clamping capacitors 107 of all the pixels is reset to the reference voltage VREF and the sampling transistors 108 of all the pixels start sampling and holding of the potential of the other end of the clamping capacitors 107.

Subsequently, when the FD reset pulse φRST is changed from the H level to the L level, the FD reset transistor 104 is turned off. Accordingly, the resetting of the FDs 103 of all the pixels ends. Subsequently, when the clamping & memory reset pulse φCL is changed from the H level to the L level, the clamping transistor 109 is turned off. Accordingly, the resetting of the analog memories 110 of all the pixels ends. At this time, the clamping capacitor 107 clamps the amplified signal (the amplified signal after the FD 103 is reset) output from the first amplification transistor 105.

Subsequently, when the transfer pulse φTX is changed from the L level to the H level, the transfer transistor 102 is turned on. Accordingly, the signal charges stored in the photoelectric conversion units 101 of all the pixels are transferred to the FDs 103 via the transfer transistors 102 and are stored in the FDs 103. Accordingly, exposure (storage of signal charges) of all the pixels ends. Subsequently, when the transfer pulse φTX is changed from the H level to the L level, the transfer transistor 102 is turned off.

Subsequently, when the sampling pulse φSH is changed from the H level to the L level, the sampling transistor 108 is turned off. Accordingly, the sampling transistors 108 of all the pixels end sampling and holding of the potential of the other end of the clamping capacitors 107. At this time, the clamping capacitor 107 clamps the amplified signal (amplified signal after signal charges are transferred from the photoelectric conversion unit 101 to the FD 103) output from the first amplification transistor 105.

Through the functions of the clamping capacitor 107 and the sampling transistor 108, the signal charges corresponding to the variation in potential of one end of the FD 103 based on the signal charges generated by the photoelectric conversion unit 101 are stored in the analog memory 110. Accordingly, it is possible to remove noise generated in the first substrate 20, such as reset noise due to the operation of the FD reset transistor 104 or noise due to a difference in circuit threshold between the first amplification transistors 105.

(Operation in Readout Period)

During a readout period, signals based on the signal charges stored in the analog memories 110 are sequentially read out for each row. First, when the FD reset pulse φRST is changed from the L level to the H level, the FD reset transistor 104 is turned on. Accordingly, the potential of one end of the FD 103 and the gate terminal of the first amplification transistor 105 is fixed to a potential based on the fixed potential (VREF) supplied from the reference voltage source.

Since the potential of the gate terminal of the first amplification transistor 105 connected to one end of the clamping capacitor 107 is fixed, the potential of one end of the clamping capacitor is also fixed and the potential of the drain terminal of the sampling transistor 108 is also fixed. During the readout period, the FD reset transistor 104 is maintained in the ON state.

Subsequently, when the selection pulse φSEL is changed from the L level to the H level, the selection transistor 112 is turned on. Accordingly, the pixel signal level based on the signal charges stored in the analog memory 110 is output to the vertical signal line 1-9.

Subsequently, when the clamping & memory reset pulse φCL is changed from the L level to the H level, the clamping transistor 109 is turned on. Accordingly, the analog memory 110 is reset and the reset level is output to the vertical signal line 1-9.

Subsequently, when the selection pulse φSEL is changed from the H level to the L level, the selection transistor 112 is turned off. At the same time, when the clamping & memory reset pulse φCL is changed from the H level to the L level, the clamping transistor 109 is turned off.

The column signal processing unit 1-6 performs removal of readout noise generated when a pixel signal is read out from the analog memory 110 by calculating a difference between the readout pixel signal level and the readout reset level. When the above-mentioned operation is sequentially performed for each row, the pixel signals of all the pixels are read out. In the above-mentioned operation, since the signal charges stored in the photoelectric conversion units 101 of all the pixels are transferred all at once, it is possible to realize simultaneous storage of signal charges.

As described above, according to this embodiment, since the FD reset transistor 104 fixes the potential of one end of the FD 103 and the gate terminal of the first amplification transistor 105 to a potential based on the fixed potential during the readout period, the potential of the drain terminal of the sampling transistor 108 is fixed. Accordingly, it is possible to suppress a variation in potential of the drain terminal of the sampling transistor 108 due to noise such as 1/f noise and thus to improve noise resistance.

Figure 7:
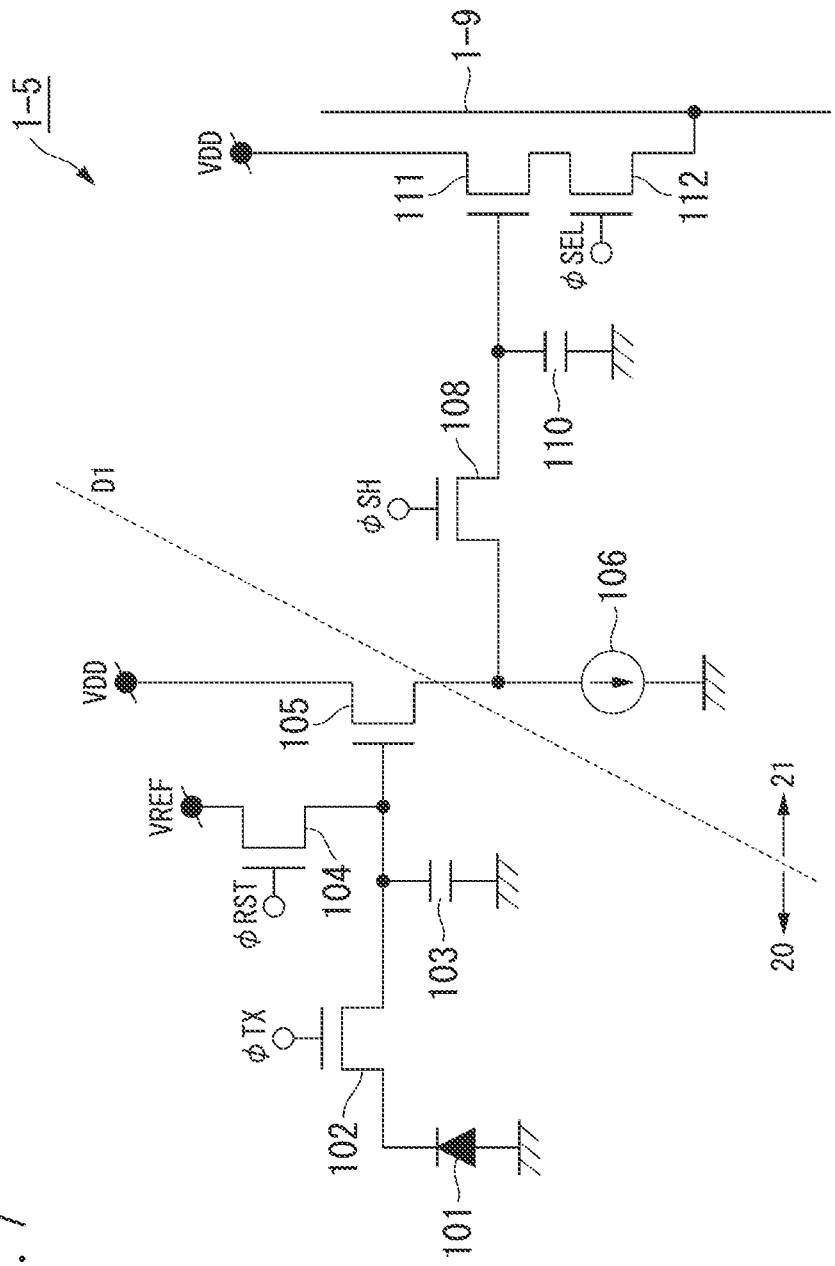
FIG. 7 is a circuit diagram illustrating a circuit configuration of a unit pixel in the solid-state imaging device according to the first embodiment of the present invention.

Modified examples of this embodiment will be described below. FIG. 7 illustrates another example of the configuration of a unit pixel 1-5. Compared with the configuration illustrated in FIG. 4, in FIG. 7, the clamping capacitor 107 and the clamping transistor 109 are removed and the drain terminal of the sampling transistor 108 is connected to the source terminal of the first amplification transistor 105 and one end of the current source 106. Configurations other than those described above are the same as illustrated in FIG. 4.

In FIG. 7, the connecting section including the micropads 22, the microbumps 24, and the micropads 23 is disposed on a path among the source terminal of the first amplification transistor 105, the drain terminal of the current source 106, and the drain terminal of the sampling transistor 108, but is not limited to this path. The connecting section may be disposed at any position on a path electrically connecting the photoelectric conversion unit 101 to the analog memory 110.

Figure 8:
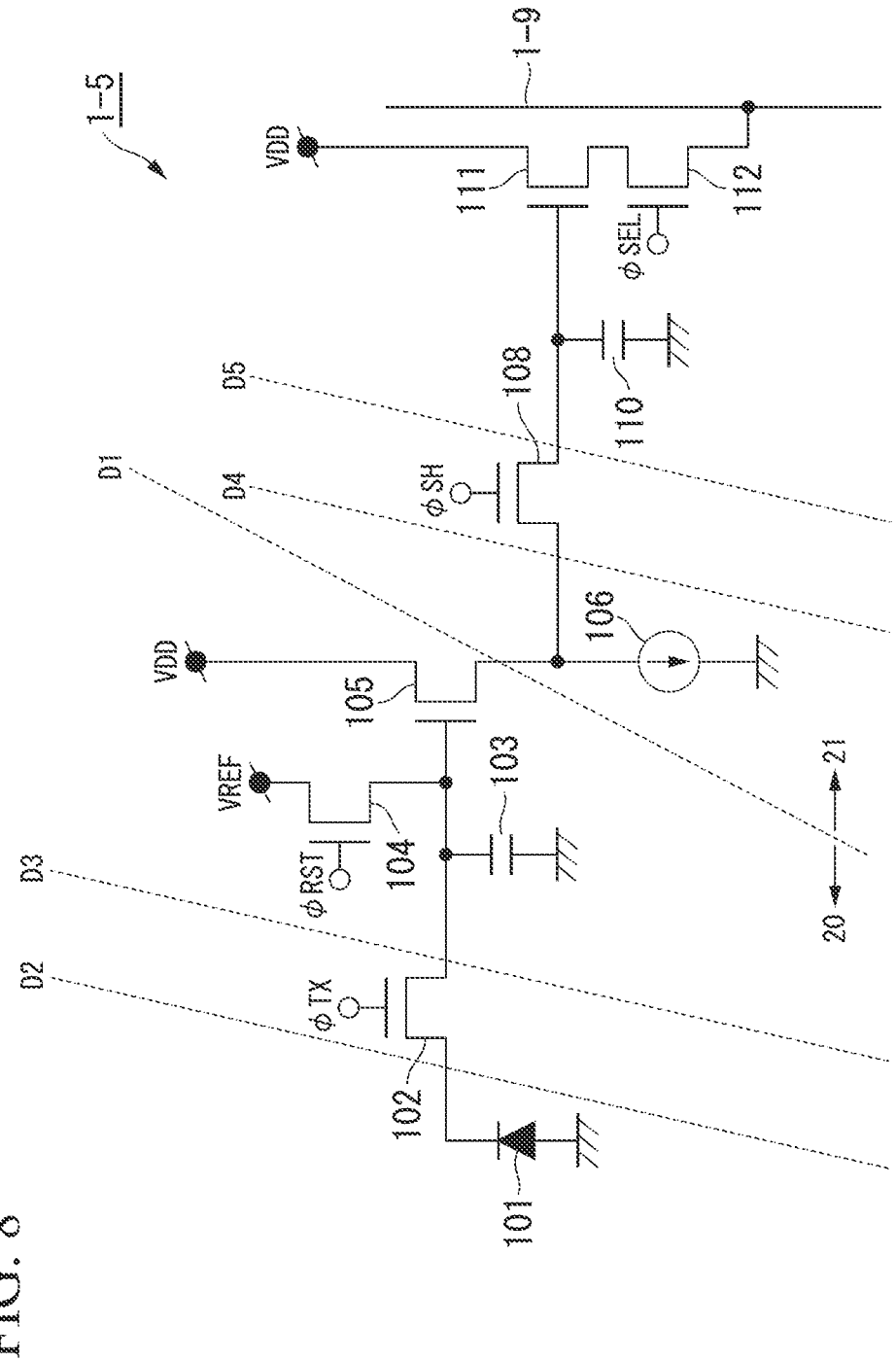
FIG. 8 is a circuit diagram illustrating a circuit configuration of a unit pixel in the solid-state imaging device according to the first embodiment of the present invention.

FIG. 8 illustrates examples of the boundary between the first substrate 20 and the second substrate 21. Dotted lines D1 to D5 indicate possible examples of the boundary between the first substrate 20 and the second substrate 21. The boundary between the first substrate 20 and the second substrate 21 may be any one of the dotted lines D1 to D5, as long as the photoelectric conversion unit 101 is disposed in the first substrate 20 and the analog memory 110 is disposed in the second substrate. The dotted line D1 is the same as described above. In the example indicated by the dotted line D2, the connecting portion is disposed on a path between the other end of the photoelectric conversion unit 101 and the drain terminal of the transfer transistor 102. In the example indicated by the dotted line D3, the connecting section is disposed on a path among the source terminal of the transfer transistor 102, one end of the FD 103, the source terminal of the FD reset transistor 104, and the gate terminal of the first amplification transistor 105.

In the example indicated by the dotted line D4, the connecting section is disposed on a path among the source terminal of the first amplification transistor 105, one end of the current source 106, and the drain terminal of the sampling transistor 108. In the example indicated by the dotted line D5, the connecting section is disposed on a path among the source terminal of the sampling transistor 108, one end of the analog memory 110, and the gate terminal of the second amplification transistor 111.

Figure 9:
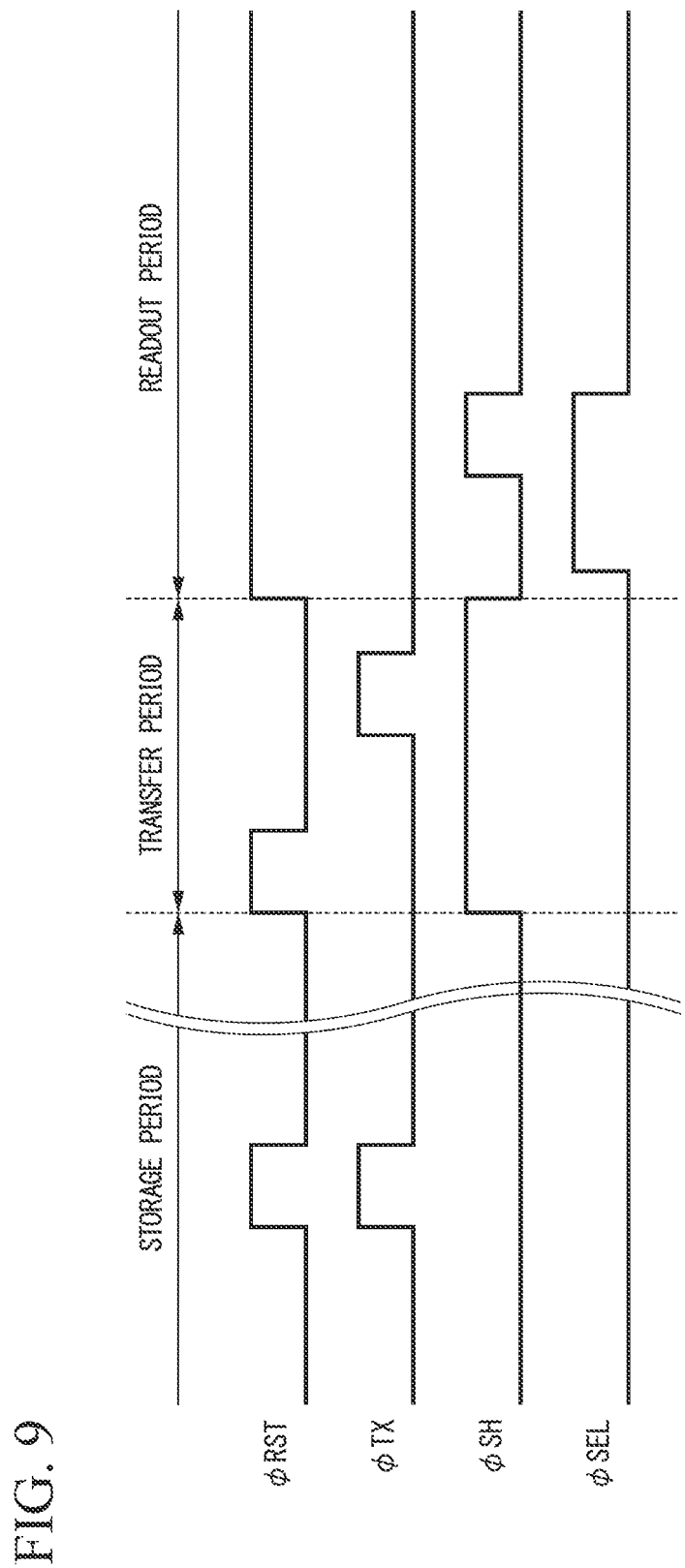
FIG. 9 is a timing chart illustrating an operation of a unit pixel in the solid-state imaging device according to the first embodiment of the present invention.

The operation of the unit pixel 1-5 illustrated in FIG. 7 will be described below with reference to FIG. 9. FIG. 9 illustrates a control signal which is supplied to the unit pixel 1-5 from the vertical readout control circuit 1-2 for each row. In the following description, operations different from the operations illustrated in FIG. 6 will be mainly described.

The operation in the storage period is the same as the operation illustrated in FIG. 6. In the transfer period, the FDs 103 of all the pixels are reset, and then the signal charges stored in the photoelectric conversion unit 101 are transferred to the FD 103 via the transfer transistor 102 and are stored in the FD 103. At the same time, the amplified signal output from the source terminal of the first amplification transistor 105 is input to the analog memory 110 and the signal charges based on the amplified signal are stored in the analog memory 110.

During the readout period, first, when the FD reset pulse φRST is changed from the L level to the H level, the FD reset transistor 104 is turned on. Accordingly, the potential of one end of the FD 103 and the gate terminal of the first amplification transistor 105 is fixed to a potential based on the fixed potential (VREF) supplied from the reference voltage source. As described above, the potential of the drain terminal of the sampling transistor 108 is fixed.

Subsequently, when the selection pulse φSEL is changed from the L level to the H level, the selection transistor 112 is turned on. Accordingly, the pixel signal level based on the signal charges stored in the analog memory 110 is output to the vertical signal line 1-9.

Subsequently, when the sampling pulse φSH is changed from the L level to the H level, the sampling transistor 108 is turned on. At this time, since the FD reset transistor 104 is turned on and the FD 103 is reset, an amplified signal based on the potential of one end of the FD 103 after being reset is output from the source terminal of the first amplification transistor 105. The amplified signal is input to the analog memory 110 and the signal charges based on the amplified signal are stored in the analog memory 110. At this time, since the selection transistor 112 is turned on, the reset level based on the potential of one end of the FD 103 after being reset is output to the vertical signal line 1-9.

Subsequently, when the selection pulse φSEL is changed from the H level to the L level, the selection transistor 112 is turned off. At the same time, when the sampling pulse φSH is changed from the H level to the L level, the sampling transistor 108 is turned off.

In the modified example, since the potential of the drain terminal of the sampling transistor 108 is fixed, it is possible to suppress a variation in potential of the drain terminal of the sampling transistor 108 due to noise such as 1/f noise and thus to improve noise resistance.

Second Embodiment

A second embodiment of the present invention will be described below. The configuration of the imaging device according to this embodiment is the same as that of the imaging device according to the first embodiment. In this embodiment, the current source 106 can be switched and operated in three modes including an OFF mode, a current setting mode, and a low-impedance setting mode.

Figure 10:
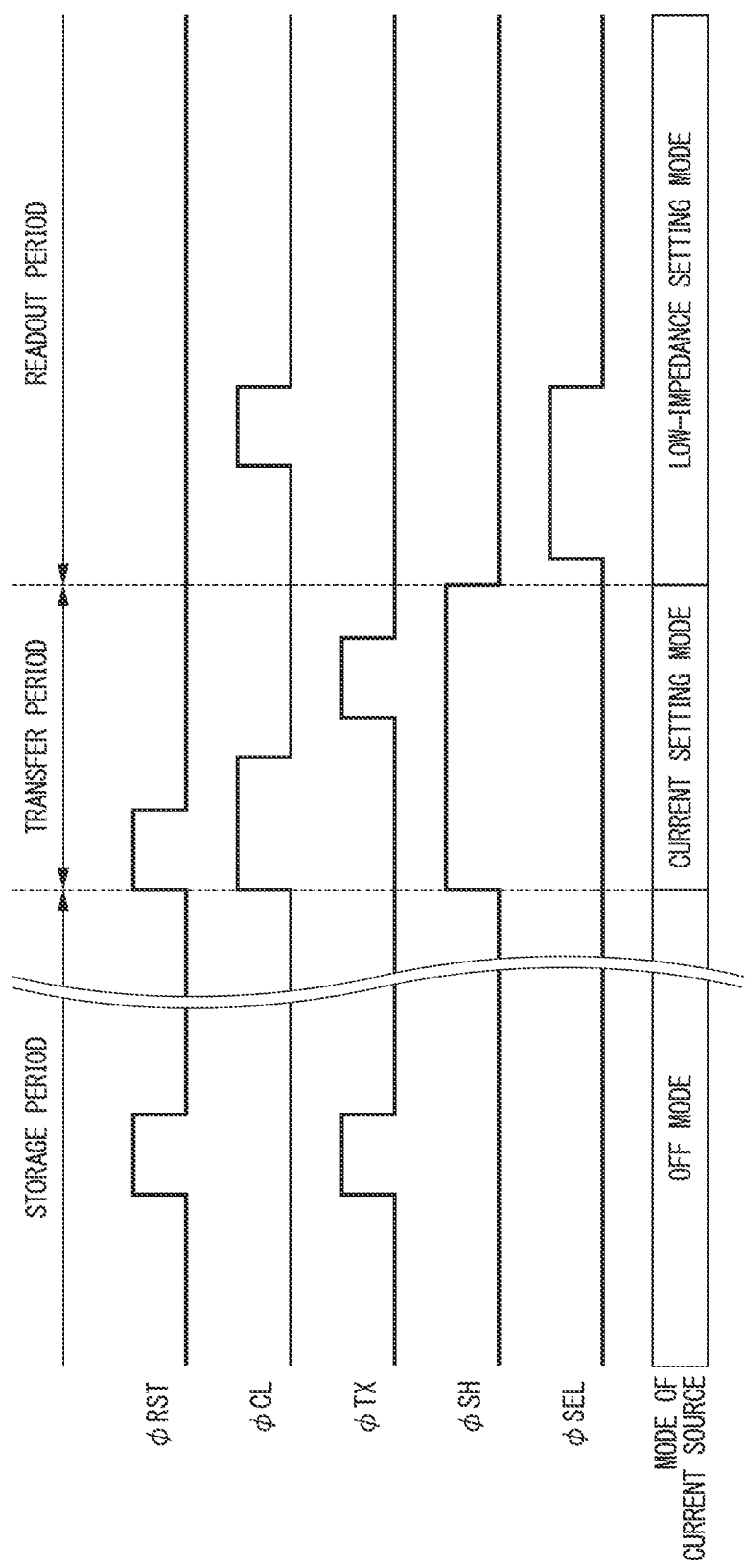
FIG. 10 is a timing chart illustrating an operation of a unit pixel in a solid-state imaging device according to a second embodiment of the present invention.

The operation of a unit pixel 1-5 will be described below with reference to FIG. 10. FIG. 10 illustrates the control signals supplied to the unit pixel 1-5 for each row from the vertical readout control circuit 1-2 and the mode of the current source 106. Operations different from the operations illustrated in FIG. 6 will be described below.

In the storage period, the current source 106 is set to the OFF mode and is deactivated. In the transfer period, the current source 106 is set to the current setting mode and outputs a current for driving the first amplification transistor 105. The impedance of the current source 106 when the current source is set to the current setting mode is higher than the impedance of the current source 106 when the current source is set to the low-impedance setting mode.

During the readout period, the FD reset transistor 104 is turned off. The current source 106 is set to the low-impedance setting mode. At this time, the potential of one end of the current source 106 connected to the source terminal of the first amplification transistor 105 and one end of the clamping capacitor 107 is substantially equal to the potential of the other end of the current source 106. For example, when the current source 106 is constituted by a transistor, the potentials of the drain terminal and the source terminal of the current source 106 are substantially equal to each other. Accordingly, the potential of one end of the clamping capacitor 107 is fixed to the potential of the other end of the current source 106, that is, a potential substantially equal to the ground potential. Accordingly, the potential of the drain terminal of the sampling transistor 108 is also fixed.

As described above, according to this embodiment, by fixing the potentials of one end and the other end of the current source 106 to substantially the same potential during the readout period, the potential of the drain terminal of the sampling transistor 108 is fixed. Accordingly, it is possible to suppress a variation in potential of the drain terminal of the sampling transistor 108 due to noise such as 1/f noise and thus to improve noise resistance.

In a modified example of this embodiment, in the unit pixel 1-5 illustrated in FIG. 7, the current source 106 may operate in the low-impedance setting mode instead of the FD reset transistor 104 being turned on during the readout period.

Third Embodiment

A third embodiment of the present invention will be described below. The configuration of an imaging device according to this embodiment is the same as that of the imaging device according to the first embodiment, except for the unit pixel 1-5.

Figure 11:
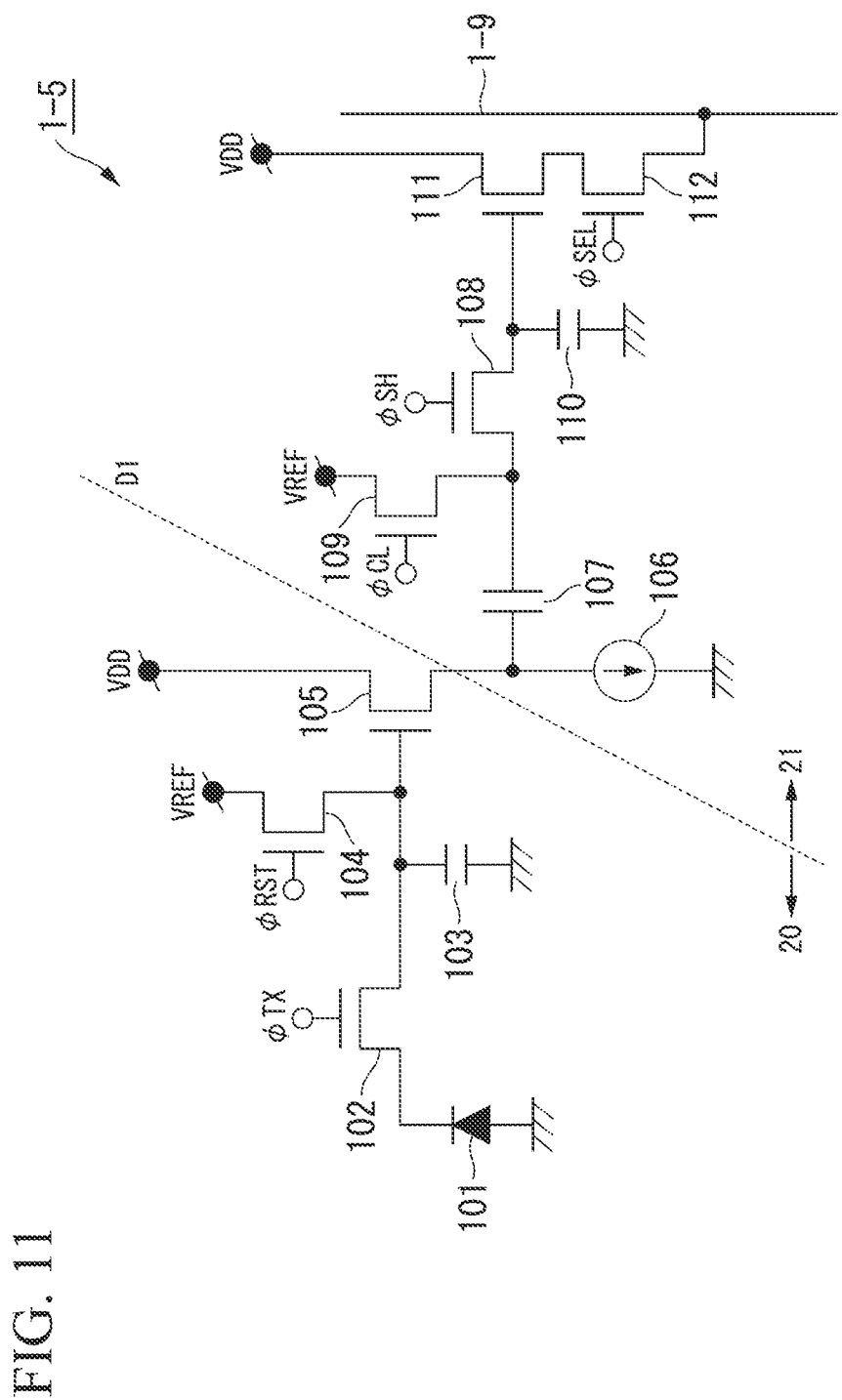
FIG. 11 is a circuit diagram illustrating a circuit configuration of a unit pixel in a solid-state imaging device according to a third embodiment of the present invention.

FIG. 11 illustrates the configuration of a unit pixel 1-5 according to this embodiment. In the unit pixel 1-5 illustrated in FIG. 11, the position at which the clamping transistor 109 is disposed is different from that in the unit pixel 1-5 illustrated in FIG. 4. In FIG. 11, the source terminal (the third terminal) of the clamping transistor 109 is connected to the other end of the clamping capacitor 107 and the drain terminal of the sampling transistor 108, and the drain terminal (the fourth terminal) of the clamping transistor 109 is connected to the reference voltage source supplying the reference voltage VREF. Other configurations are the same as those of the unit pixel 1-5 illustrated in FIG. 4.

In FIG. 11, the connecting section including the micropads 22, the microbumps 24, and the micropads 23 is disposed on a path among the source terminal of the first amplification transistor 105, the drain terminal of the current source 106, and one end of the clamping capacitor 107, but is not limited to this path. The connecting section may be disposed at any position on a path electrically connecting the photoelectric conversion unit 101 to the analog memory 110.

Figure 12:
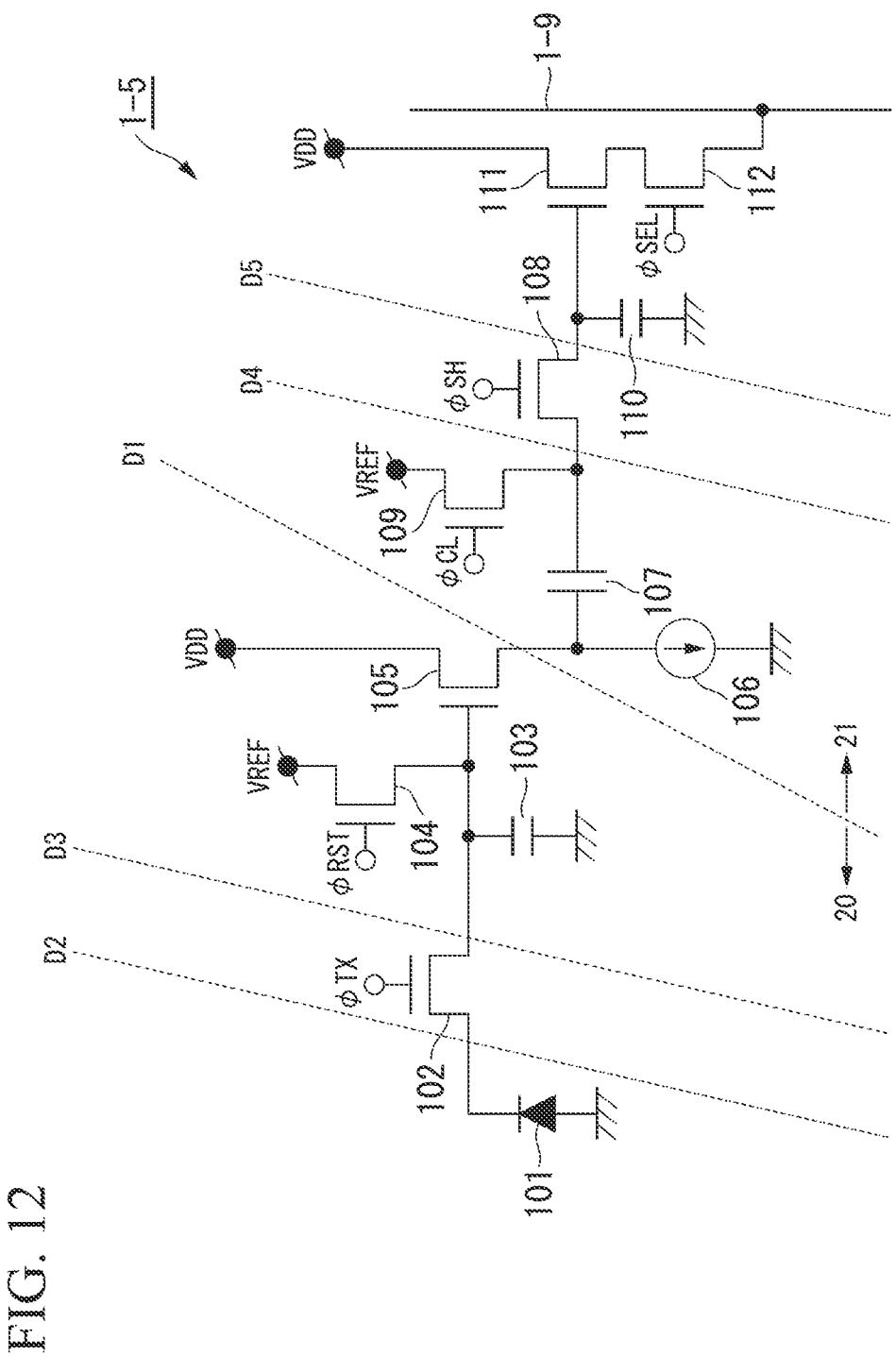
FIG. 12 is a circuit diagram illustrating a circuit configuration of a unit pixel in the solid-state imaging device according to the third embodiment of the present invention.

FIG. 12 illustrates examples of the boundary between the first substrate 20 and the second substrate 21. Dotted lines D1 to D5 indicate possible examples of the boundary between the first substrate 20 and the second substrate 21. The boundary between the first substrate 20 and the second substrate 21 may be any one of the dotted lines D1 to D5, as long as the photoelectric conversion unit 101 is disposed in the first substrate 20 and the analog memory 110 is disposed in the second substrate. The dotted line D1 is the same as described above. In the example indicated by the dotted line D2, the connecting portion is disposed on a path between the other end of the photoelectric conversion unit 101 and the drain terminal of the transfer transistor 102. In the example indicated by the dotted line D3, the connecting section is disposed on a path among the source terminal of the transfer transistor 102, one end of the FD 103, the source terminal of the FD reset transistor 104, and the gate terminal of the first amplification transistor 105.

In the example indicated by the dotted line D4, the connecting section is disposed on a path among the source terminal of the clamping transistor 109, the other end of the clamping capacitor 107, and the drain terminal of the sampling transistor 108. In the example indicated by the dotted line D5, the connecting section is disposed on a path among the source terminal of the sampling transistor 108, one end of the analog memory 110, and the gate terminal of the second amplification transistor 111.

As will be described below in detail, the clamping transistor 109 fixes the potential of the drain terminal of the sampling transistor to a potential based on the fixed potential (VREF) supplied from the reference voltage source during the readout period.

Figure 13:
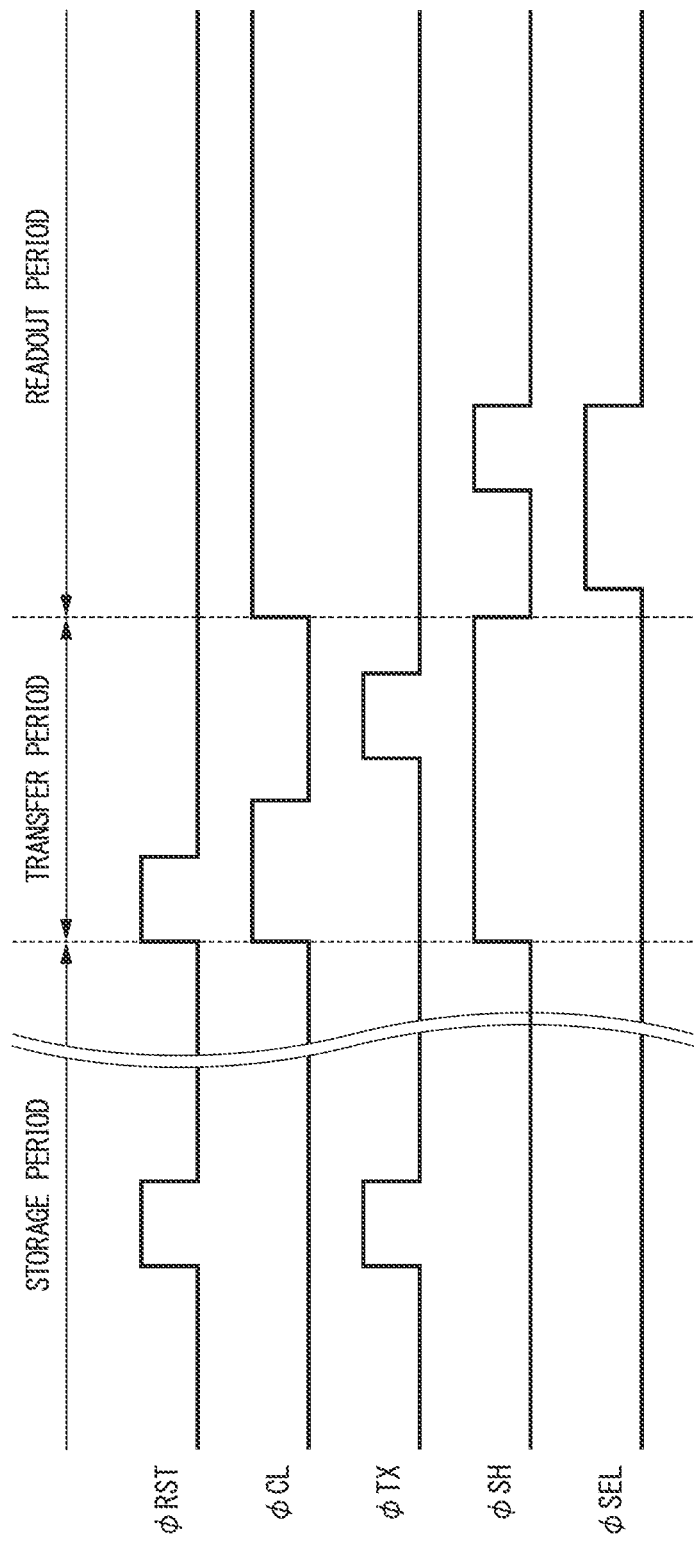
FIG. 13 is a timing chart illustrating an operation of a unit pixel in the solid-state imaging device according to the third embodiment of the present invention.

The operation of a unit pixel 1-5 will be described below with reference to FIG. 13. FIG. 13 illustrates the control signals supplied to the unit pixel 1-5 for each row from the vertical readout control circuit 1-2. Operations different from the operations illustrated in FIG. 6 will be described below.

The operations in the storage period and the transfer period are the same as the operations illustrated in FIG. 6. During the readout period, the FD reset transistor 104 is turned off. When the clamping & memory reset pulse φCL is changed from the L level to the H level, the clamping transistor 109 is turned on. Accordingly, the potential of the drain terminal of the sampling transistor 108 is fixed to a potential based on the fixed potential (VREF) supplied from the reference voltage source.

Subsequently, when the selection pulse φSEL is changed from the L level to the H level, the selection transistor 112 is turned on. Accordingly, the pixel signal level based on the signal charges stored in the analog memory 110 is output to the vertical signal line 1-9.

Subsequently, when the sampling pulse φSH is changed from the L level to the H level, the sampling transistor 108 is turned on. Accordingly, the analog memory 110 is reset and the reset level is output to the vertical signal line 1-9.

Subsequently, when the selection pulse φSEL is changed from the H level to the L level, the selection transistor 112 is turned off. At the same time, when the sampling pulse φSH is changed from the H level to the L level, the sampling transistor 108 is turned off.

As described above, according to this embodiment, the clamping transistor 109 fixes the potential of the drain terminal of the sampling transistor 108 to a potential based on the fixed potential during the readout period. Accordingly, it is possible to suppress a variation in potential of the drain terminal of the sampling transistor 108 due to noise such as 1/f noise and thus to improve noise resistance.

Fourth Embodiment

A fourth embodiment of the present invention will be described below. The configuration of an imaging device according to this embodiment is the same as that of the imaging device according to the third embodiment, except for the unit pixel 1-5.

Figure 14:
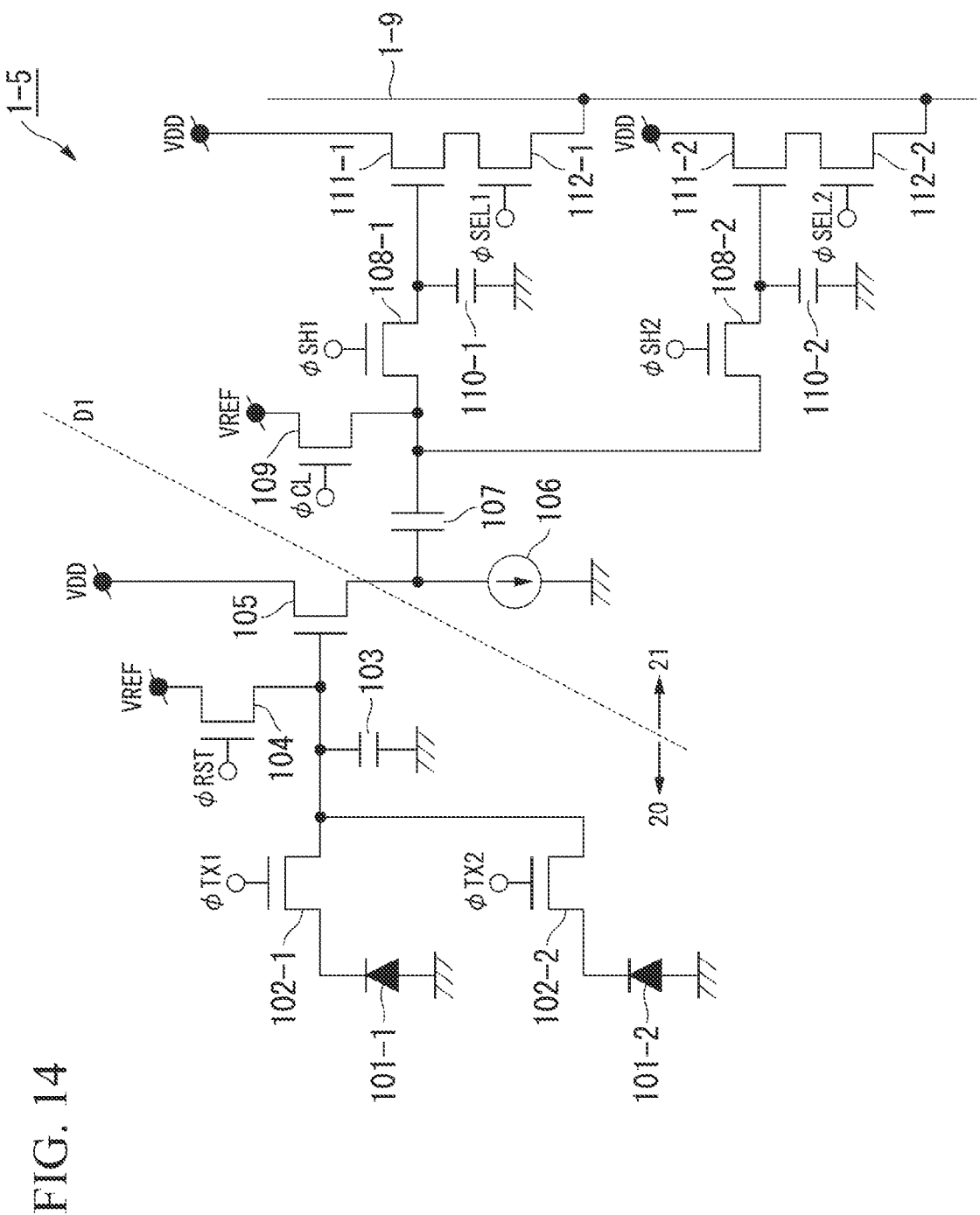
FIG. 14 is a circuit diagram illustrating a circuit configuration of a unit pixel in a solid-state imaging device according to a fourth embodiment of the present invention.

FIG. 14 illustrates a circuit configuration of two unit pixels 1-5 which are adjacent to each other in the vertical direction. The (two) unit pixels 1-5 include photoelectric conversion units 101-1 and 101-2, transfer transistors 102-1 and 102-2, an FD 103, an FD reset transistor 104, a first amplification transistor 105, a current source 106, a clamping capacitor 107, sampling transistors 108-1 and 108-2, a clamping transistor 109, analog memories 110-1 and 110-2, second amplification transistors 111-1 and 111-2, and selection transistors 112-1 and 112-2.

FIG. 14 illustrates the circuit elements of a first unit pixel and the circuit elements of a second unit pixel. The first unit pixel includes the photoelectric conversion unit 101-1, the transfer transistor 102-1, the FD 103, the FD reset transistor 104, the first amplification transistor 105, the current source 106, the clamping capacitor 107, the sampling transistor 108-1, the clamping transistor 109, the analog memory 110-1, the second amplification transistor 111-1, and the selection transistor 112-1. The second unit pixel includes the photoelectric conversion unit 101-2, the transfer transistor 102-2, the FD 103, the FD reset transistor 104, the first amplification transistor 105, the current source 106, the clamping capacitor 107, the sampling transistor 108-2, the clamping transistor 109, the analog memory 110-2, the second amplification transistor 111-2, and the selection transistor 112-2. The FD 103, the FD reset transistor 104, the first amplification transistor 105, the current source 106, the clamping capacitor 107, and the clamping transistor 109 are shared by the first unit pixel and the second unit pixel.

When the two unit pixels 1-5 are individually observed, the connection relationship of the circuit elements of each unit pixel 1-5 is the same as the connection relationship of the circuit elements in the unit pixel 1-5 illustrated in FIG. 11. The source terminals of the transfer transistors 102-1 and 102-2 are commonly connected to one end of the FD 103, the source terminal of the FD reset transistor 104, and the gate terminal of the first amplification transistor 105. The drain terminals of the sampling transistors 108-1 and 108-2 are commonly connected to the other end of the clamping capacitor 107 and the source terminal of the clamping transistor 109.

The gate terminal of the transfer transistor 102-1 is supplied with a transfer pulse φTX1 from the vertical readout control circuit 1-2 and the gate terminal of the transfer transistor 102-2 is supplied with a transfer pulse φTX2 from the vertical readout control circuit 1-2. The gate terminal of the sampling transistor 108-1 is supplied with a sampling pulse φSH1 from the vertical readout control circuit 1-2 and the gate terminal of the sampling transistor 108-2 is supplied with a sampling pulse φSH2 from the vertical readout control circuit 1-2. The gate terminal of the selection transistor 112-1 is supplied with a selection pulse φSEL1 from the vertical readout control circuit 1-2 and the gate terminal of the selection transistor 112-2 is supplied with a selection pulse φSEL2 from the vertical readout control circuit 1-2.

In FIG. 14, the connecting section including the micropads 22, the microbumps 24, and the micropads 23 is disposed on a path among the source terminal of the first amplification transistor 105, the drain terminal of the current source 106, and one end of the clamping capacitor 107, but is not limited to this path. The connecting section may be disposed at any position on a path electrically connecting the photoelectric conversion unit 101 to the analog memory 110.

Figure 15:
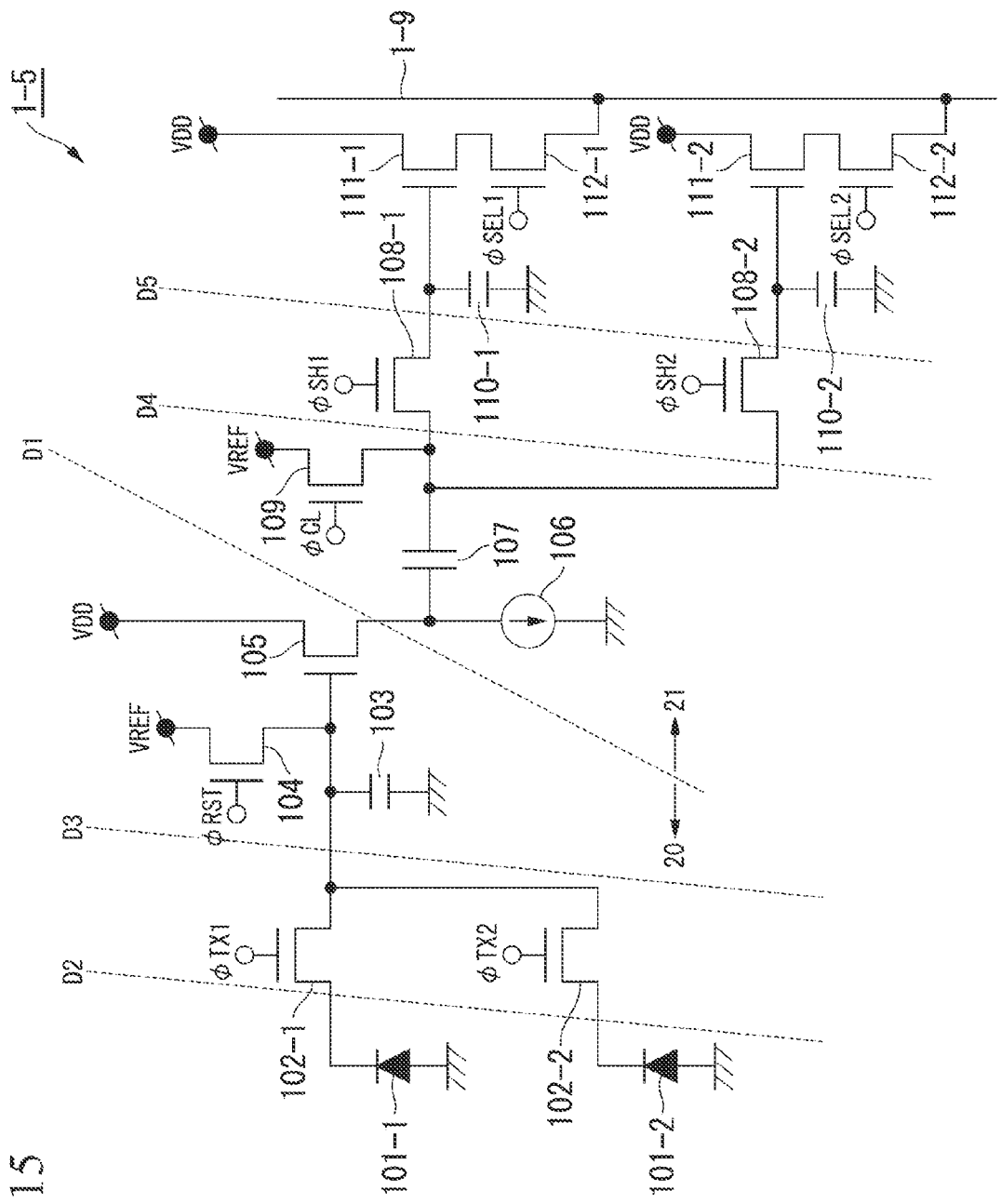
FIG. 15 is a circuit diagram illustrating a circuit configuration of a unit pixel in the solid-state imaging device according to the fourth embodiment of the present invention.

FIG. 15 illustrates examples of the boundary between the first substrate 20 and the second substrate 21. Dotted lines D1 to D5 indicate possible examples of the boundary between the first substrate 20 and the second substrate 21. The boundary between the first substrate 20 and the second substrate 21 may be any one of the dotted lines D1 to D5, as long as the photoelectric conversion units 101-1 and 101-2 are disposed in the first substrate 20 and the analog memories 110-1 and 110-2 are disposed in the second substrate. The dotted line D1 is the same as described above.

In the example indicated by the dotted line D2, the connecting portion is disposed on a path between the end on the other side of the photoelectric conversion units 101-1 and 101-2 and the drain terminal of the transfer transistor 102. In the example indicated by the dotted line D3, the connecting section is disposed on a path among the source terminals of the transfer transistors 102-1 and 102-2, one end of the FD 103, the source terminal of the FD reset transistor 104, and the gate terminal of the first amplification transistor 105.

In the example indicated by the dotted line D4, the connecting section is disposed on a path among the source terminal of the clamping transistor 109, the other end of the clamping capacitor 107, and the drain terminals of the sampling transistors 108-1 and 108-2. In the example indicated by the dotted line D5, the connecting section is disposed on a path among the source terminals of the sampling transistors 108-1 and 108-2, the ends on one side of the analog memories 110-1 and 110-2, and the gate terminals of the second amplification transistors 111-1 and 111-2.

Figure 16:
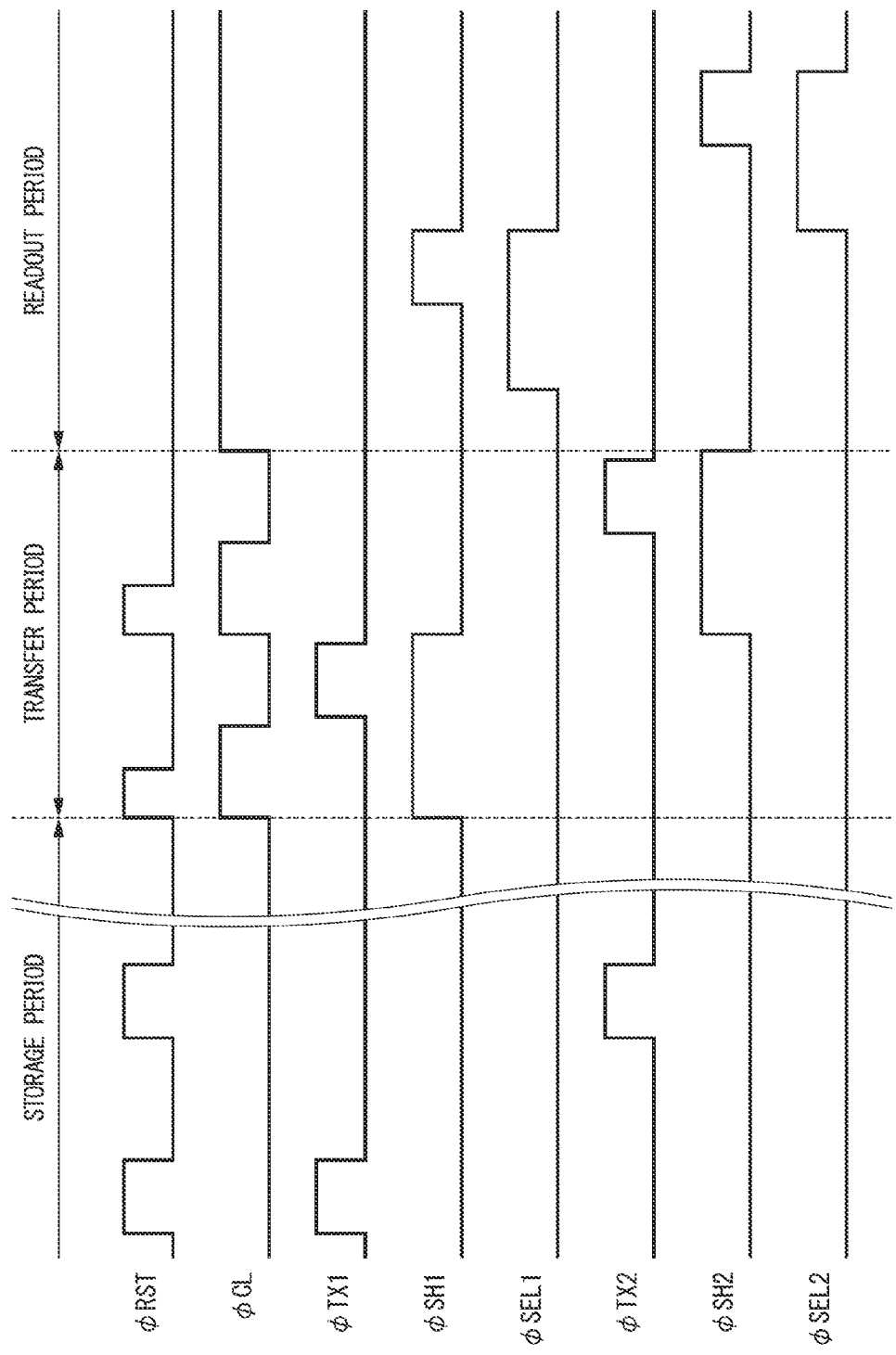
FIG. 16 is a timing chart illustrating an operation of a unit pixel in the solid-state imaging device according to the fourth embodiment of the present invention.

The operation of a unit pixel 1-5 will be described below with reference to FIG. 16. FIG. 16 illustrates the control signals supplied to the unit pixel 1-5 for each row from the vertical readout control circuit 1-2. Operations will be described below in the units of two unit pixels 1-5 illustrated in FIG. 14.

(Operation in Storage Period)

In the storage period, the resetting of the photoelectric conversion units 101-1 and 101-2 of two unit pixels 1-5 is performed for each unit pixel. After the photoelectric conversion unit 101-1 of the first unit pixel is reset, the photoelectric conversion unit 101-2 of the second unit pixel is reset. The operations of the unit pixels 1-5 in the storage period are the same as the operation of the unit pixel 1-5 in the storage period illustrated in FIG. 13.

(Operation in Transfer Period)

In the transfer period, operations including the resetting of the FD 103 which is common to two unit pixels 1-5 and the transferring of the signal charges stored in the photoelectric conversion units 101-1 and 101-2 of two unit pixels 1-5 are performed for each unit pixel. After the resetting of the FD 103 and the transferring of the signal charges of the first unit pixel are performed, the resetting of the FD 103 and the transferring of the signal charges of the second unit pixel are performed. The operations of the unit pixels 1-5 in the transfer period are the same as the operation of the unit pixel 1-5 in the transfer period illustrated in FIG. 13.

(Operation in Readout Period)

During the readout period, the readout of signals in two unit pixels 1-5 is performed for each unit pixel. After the readout of signals in the first unit pixel is performed, the readout of signals in the second unit pixel is performed. The operations of the unit pixels 1-5 during the readout period are the same as the operation of the unit pixel 1-5 during the readout period illustrated in FIG. 13. During the readout period, the clamping transistor 109 is maintained in the ON state. Accordingly, the potentials of the drain terminals of the sampling transistors 108-1 and 108-2 are fixed to a potential based on the fixed potential (VREF) supplied from the reference voltage source.

As described above, according to this embodiment, the clamping transistor 109 fixes the potentials of the drain terminals of the sampling transistors 108-1 and 108-2 to a potential based on the fixed potential during the readout period. Accordingly, it is possible to suppress a variation in potential of the drain terminals of the sampling transistors 108-1 and 108-2 due to noise such as 1/f noise and thus to improve noise resistance.

Since the clamping transistor 109 is shared by a plurality of unit pixels 1-5 in addition to the FD 103, the FD reset transistor 104, the first amplification transistor 105, the current source 106, and the clamping capacitor 107, it is possible to reduce a circuit area. In this embodiment, two unit pixels 1-5 share some circuit elements including the clamping transistor 109, but three or more unit pixels 1-5 may share some circuit elements.

Fifth Embodiment

A fifth embodiment of the present invention will be described below. The configuration of an imaging device according to this embodiment is the same as that of the imaging device according to the third embodiment, except for the unit pixel 1-5.

Figure 17:
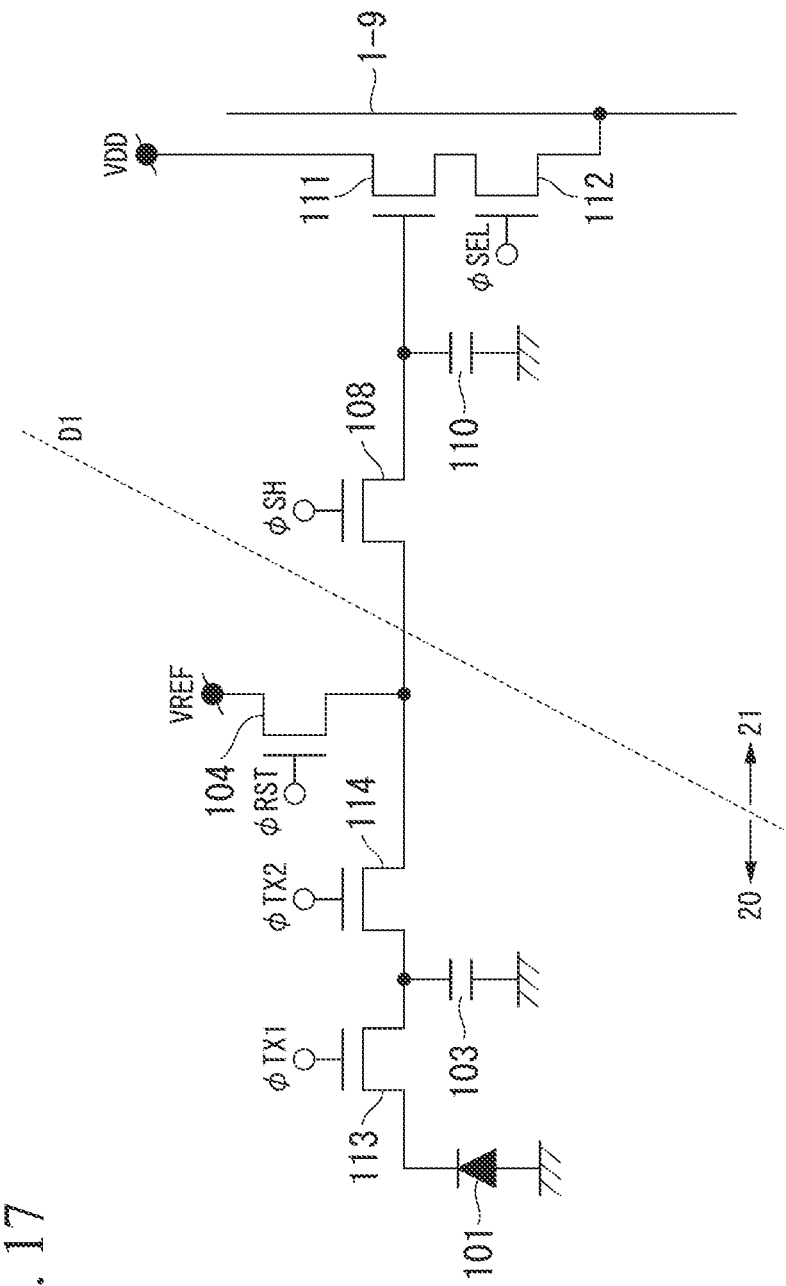
FIG. 17 is a circuit diagram illustrating a circuit configuration of a unit pixel in a solid-state imaging device according to a fifth embodiment of the present invention.

FIG. 17 illustrates the configuration of a unit pixel 1-5 according to this embodiment. The unit pixel 1-5 illustrated in FIG. 17 is different from the unit pixel 1-5 illustrated in FIG. 4, in that the first amplification transistor 105, the current source 106, the clamping capacitor 107, and the clamping transistor 109 are removed, a second transfer transistor 114 is added, and the transfer transistor 102 is changed to a first transfer transistor 113.

In FIG. 17, the drain terminal of the second transfer transistor 114 is connected to the source terminal of the first transfer transistor 113 and one end of the FD 103 and the source terminal of the second transfer transistor 114 is connected to the drain terminal of the sampling transistor 108. The gate terminal of the second transfer transistor 113 is connected to the vertical readout control circuit 1-2 and is supplied with a transfer pulse φTX2. The gate terminal of the first transfer transistor 113 is supplied with a transfer pulse φTX1 from the vertical readout control circuit 1-2. Other configurations are the same as those of the unit pixel 1-5 illustrated in FIG. 4.

In FIG. 17, the connecting section including the micropads 22, the microbumps 24, and the micropads 23 is disposed on a path among the source terminal of the second transfer transistor 114, the source terminal of the FD reset transistor 104, and the drain terminal of the sampling transistor 108, but is not limited to this path. The connecting section may be disposed at any position on a path electrically connecting the photoelectric conversion unit 101 to the analog memory 110.

Figure 18:
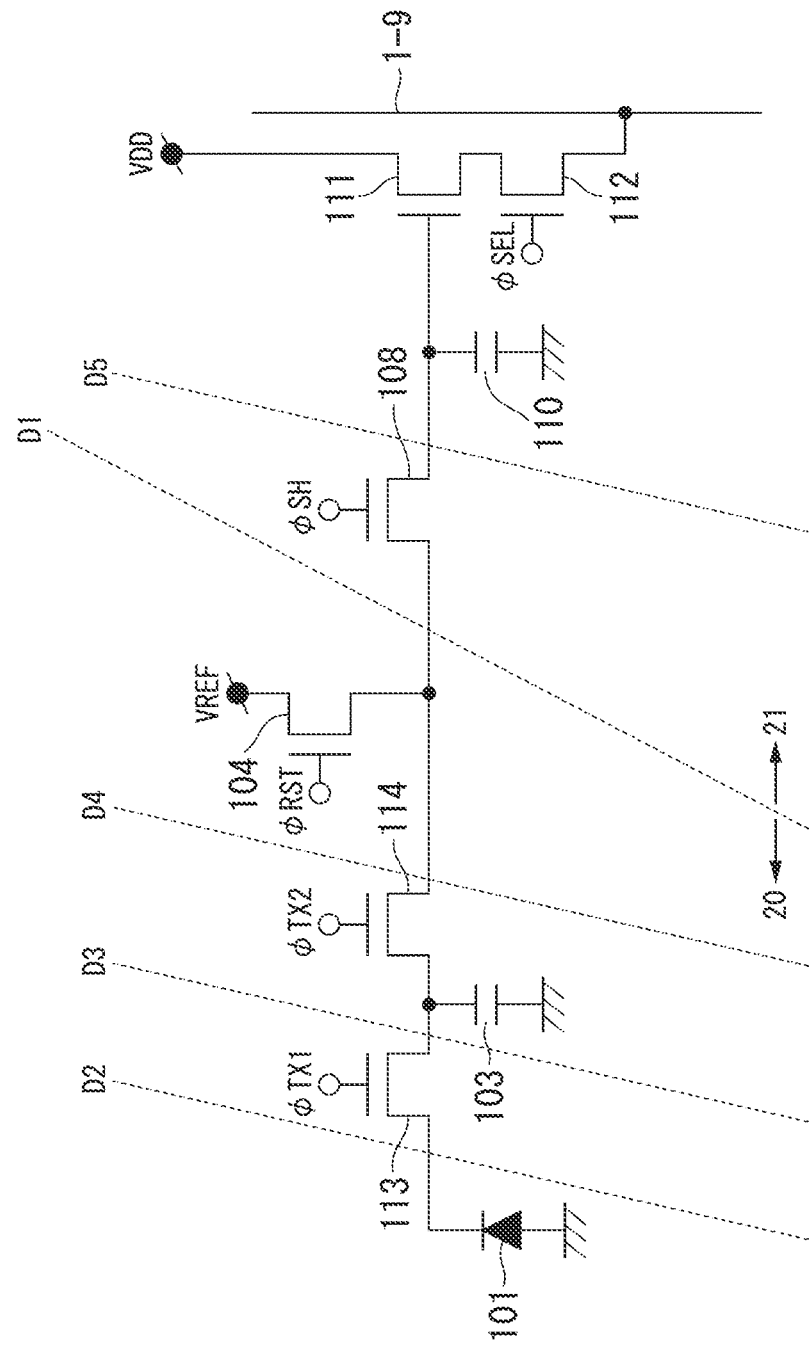
FIG. 18 is a circuit diagram illustrating a circuit configuration of a unit pixel in the solid-state imaging device according to the fifth embodiment of the present invention.

FIG. 18 illustrates examples of the boundary between the first substrate 20 and the second substrate 21. Dotted lines D1 to D5 indicate possible examples of the boundary between the first substrate 20 and the second substrate 21. The boundary between the first substrate 20 and the second substrate 21 may be any one of the dotted lines D1 to D5, as long as the photoelectric conversion unit 101 is disposed in the first substrate 20 and the analog memory 110 is disposed in the second substrate. The dotted line D1 is the same as described above. In the example indicated by the dotted line D2, the connecting portion is disposed on a path between the other end of the photoelectric conversion unit 101 and the drain terminal of the first transfer transistor 113. In the example indicated by the dotted line D3, the connecting section is disposed on a path among the source terminal of the first transfer transistor 113, one end of the FD 103, and the drain terminal of the second transfer transistor 114.

In the example indicated by dotted line D4, the connecting section is disposed on a path among the source terminal of the second transfer transistor 114, the source terminal of the FD reset transistor 104, and the drain terminal of the sampling transistor 108. In the example indicated by dotted line D5, the connecting section is disposed on a path among the source terminal of the sampling transistor 108, one end of the analog memory 110, and the gate terminal of the second amplification transistor 111.

The operation of a unit pixel 1-5 will be described below with reference to FIG. 19. FIG. 19 illustrates the control signals supplied to the unit pixel 1-5 for each row from the vertical readout control circuit 1-2.

(Operation in Storage Period)

The storage period is a period common to all the pixels and the operation is simultaneously performed in all the pixels in the storage period. When the storage period starts, the FD reset pulse φRST, the transfer pulse φTX2, and the sampling pulse φSH are at the H level and the FD reset transistor 104, the second transfer transistor 114, and the sampling transistor 108 are turned on. Accordingly, the FDs 103 and the analog memories 110 of all the pixels are reset.

First, when the transfer pulse φTX1 is changed from the L level to the H level, the first transfer transistor 113 is turned on. Accordingly, the photoelectric conversion units 101 of all the pixels are reset. Subsequently, when the transfer pulse φTX1 is changed from the H level to the L level, the first transfer transistor 113 is turned off. Accordingly, the resetting of all the pixels ends and exposure (storage of signal charges) of all the pixels starts all at once (start of an exposure period).

(Operation in Transfer Period)

The transfer period is a period common to all the pixels, and the operation is simultaneously performed in all the pixels in the transfer period. First, when the transfer pulse φTX2 is changed from the H level to the L level, the second transfer transistor 114 is turned off. Subsequently, when the transfer pulse φTX1 is changed from the L level to the H level, the first transfer transistor 113 is turned on. Accordingly, the signal charges stored in the photoelectric conversion unit 101 are transferred to the FDs 103 via the first transfer transistor 113 and are stored in the FD 103. Accordingly, exposure (storage of signal charges) of all the pixels ends.

Subsequently, when the FD reset pulse φRST is changed from the H level to the L level, the FD reset transistor 104 is turned off. Subsequently, when the transfer pulse φTX1 is changed from the H level to the L level, the first transfer transistor 113 is turned off. Subsequently, when the transfer pulse φTX2 is changed from the L level to the H level, the second transfer transistor 114 is turned on. Accordingly, the signal charges stored in the FD 103 are transferred to the analog memory 110 via the second transfer transistor 114 and the sampling transistor 108 and are stored in the analog memory 110.

Subsequently, when the sampling pulse φSH is changed from the H level to the L level, the sampling transistor 108 is turned off. Subsequently, when the FD reset pulse φRST is changed from the L level to the H level, the FD reset transistor 104 is turned on. Accordingly, the potential of the drain terminal of the sampling transistor 108 is fixed to a potential based on the fixed potential (VREF) supplied from the reference voltage source.

(Operation in Readout Period)

During the readout period, signals based on the signal charges stored in the analog memory 110 are sequentially read out for each row. During the readout period, the FD reset transistor 104 is maintained in the ON state and the potential of the drain terminal of the sampling transistor 108 is fixed.

First, when the selection pulse φSEL is changed from the L level to the H level, the selection transistor 112 is turned on. Accordingly, the pixel signal level based on the signal charges stored in the analog memory 110 is output to the vertical signal line 1-9.

Subsequently, when the sampling pulse φSH is changed from the L level to the H level, the sampling transistor 108 is turned on. Accordingly, the analog memory 110 is reset and the reset level is output to the vertical signal line 1-9. Subsequently, when the selection pulse φSEL is changed from the H level to the L level, the selection transistor 112 is turned off.

The column signal processing unit 1-6 performs removal of readout noise generated when a pixel signal is read out from the analog memory 110 by calculating a difference between the read out pixel signal level and the read out reset level. When the above-mentioned operation is sequentially performed for each row, the pixel signals of all the pixels are read out. In the above-mentioned operation, since the signal charges stored in the photoelectric conversion units 101 of all the pixels are transferred all at once, it is possible to realize simultaneous storage of signal charges.

As described above, according to this embodiment, the FD reset transistor 104 fixes the potential of the drain terminal of the sampling transistor 108 to a potential based on the fixed potential during the readout period. Accordingly, it is possible to suppress a variation in potential of the drain terminal of the sampling transistor 108 due to noise such as 1/f noise and thus to improve noise resistance.

While embodiments of the present invention have been described above with reference to the drawings, the specific configurations of the present invention are not limited to the above-mentioned embodiments and also include design modifications without departing from the gist of the present invention. Although the configuration of the solid-state imaging device in which two substrates are connected to each other via the connecting section has been described above, three or more substrates may be connected to each other via the connecting section. In a solid-state imaging device in which three or more substrates are connected to each other via the connecting section, two substrates of the three or more substrates correspond to the first substrate and the second substrate.

The aspects of the present invention can be widely applied to solid-state imaging devices and imaging devices. Since the potential of the first terminal of the sampling transistor is fixed to a potential based on a predetermined fixed potential during the readout period, it is possible to suppress a variation in potential of the first terminal of the sampling transistor due to mixture of noise and thus to improve noise resistance.

What is claimed is:

1. A solid-state imaging device in which a first substrate and a second substrate having circuit elements, which constitute pixels, arranged thereon are electrically connected to each other, wherein each pixel includes:
a photoelectric conversion unit that is disposed on the first substrate and outputs a signal based on incident light;
a sampling transistor that is disposed on the second substrate, includes a gate terminal, a source terminal, and a drain terminal, samples and holds the signal input from the photoelectric conversion unit to a first terminal which is one of the source terminal or the drain terminal, and outputs the sampled and held signal from a second terminal which is the other of the source terminal or the drain terminal;
a capacitor that is disposed on the second substrate and stores the signal output from the second terminal;
a potential fixing circuit that fixes a potential of the first terminal to a potential based on a predetermined fixed potential during a readout period in which the signal stored in the capacitor is read out; and wherein each pixel further includes:
an amplification transistor that is disposed on the first substrate, includes a second gate terminal to which a signal output from the photoelectric conversion unit is input, a second source terminal, and a second drain terminal, amplifies the signal input to the second gate terminal, and outputs the amplified signal from one of the second source terminal or the second drain terminal; and
a current source that is disposed on the first substrate or the second substrate and includes a first end, which is connected to either of the second source terminal or the second drain terminal of the amplification transistor, and a second end, and
wherein the fixed potential is input to the second end of the current source during the readout period and consequently the first end and the second end have substantially the same potential.

2. The solid-state imaging device according to claim 1, wherein each pixel further includes:
a clamping capacitor that is disposed on the first substrate or the second substrate and clamps the signal output from the photoelectric conversion unit; and
a clamping transistor that is disposed on the same substrate as the substrate on which the clamping capacitor is disposed and includes a second gate terminal, a second source terminal, and a second drain terminal, in which a third terminal which is one of the second source terminal or the second drain terminal is connected to the clamping capacitor and the first terminal of the sampling transistor and a fourth terminal which is the other of the second source terminal or the second drain terminal is connected to a voltage source supplying the fixed potential, and
wherein the clamping transistor is included in the potential fixing circuit and fixes the potential of the first terminal to a potential based on the fixed potential supplied from the voltage source during the readout period.

3. The solid-state imaging device according to claim 2, comprising a plurality of the pixels,
wherein the single clamping capacitor and the single clamping transistor are shared by the plurality of pixels.

4. The solid-state imaging device according to claim 1, wherein each pixel further includes:
an amplification transistor that is disposed on the first substrate, includes a second gate terminal to which the signal output from the photoelectric conversion unit is input, a second source terminal, and a second drain terminal, amplifies the signal input to the second gate terminal, and outputs the amplified signal from one of the second source terminal or the second drain terminal; and
a reset transistor that is disposed on the first substrate, includes a third gate terminal, a third source terminal, and a third drain terminal, and resets the photoelectric conversion unit, in which a third terminal which is one of the third source terminal or the third drain terminal is connected to a voltage source supplying the fixed potential and a fourth terminal which is the other of the third source terminal or the third drain terminal is connected to the photoelectric conversion unit, and wherein the reset transistor is included in the potential fixing circuit and fixes the potential of the first terminal by fixing the potential of the second gate terminal of the amplification transistor to a potential based on the fixed potential supplied from the voltage source during the readout period.

5. An imaging device comprising the solid-state imaging device according to claim 1.

6. A solid-state imaging device in which a first substrate and a second substrate having circuit elements, which constitute pixels, arranged thereon are electrically connected to each other, wherein each pixel includes:

a photoelectric conversion unit that is disposed on the first substrate and that outputs a signal based on incident light;

a sampling transistor that is disposed on the first substrate, that includes a gate terminal, a source terminal, and a drain terminal, samples and holds the signal input from the photoelectric conversion unit to a first terminal which is one of the source terminal or the drain terminal, and outputs the sampled and held signal from a second terminal which is the other of the source terminal or the drain terminal;

a capacitor that is disposed on the second substrate and stores the signal output from the second terminal;

a potential fixing circuit that fixes a potential of the first terminal to a potential based on a predetermined fixed potential during a readout period in which the signal stored in the capacitor is read out; and wherein each pixel further includes:

a clamping capacitor that is disposed on the first substrate and clamps the signal output from the photoelectric conversion unit; and a clamping transistor that is disposed on the first substrate and includes a second gate terminal, a second source terminal, and a second drain terminal, in which a third terminal which is one of the second source terminal or the second drain terminal is connected to the clamping capacitor and the first terminal of the sampling transistor and a fourth terminal which is the other of the second source terminal or the second drain terminal is connected to a voltage source supplying the fixed potential, and wherein the clamping transistor is included in the potential fixing circuit and fixes the potential of the first terminal to a potential based on the fixed potential supplied from the voltage source during the readout period.

7. The solid-state imaging device according to claim 6, comprising a plurality of the pixels, wherein the single clamping capacitor and the single clamping transistor are shared by the plurality of pixels.

* * * * *